(12) United States Patent
Jang et al.

(10) Patent No.: US 11,538,755 B2
(45) Date of Patent: Dec. 27, 2022

(54) SEMICONDUCTOR DEVICE

(71) Applicant: SK hynix Inc., Icheon-si (KR)

(72) Inventors: Nam-Hea Jang, Icheon-si (KR); Young-Hoon Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 18 days.

(21) Appl. No.: 17/361,661

(22) Filed: Jun. 29, 2021

(65) Prior Publication Data

US 2021/0327812 A1 Oct. 21, 2021

Related U.S. Application Data

(63) Continuation of application No. 16/598,812, filed on Oct. 10, 2019, now Pat. No. 11,081,446.

(30) Foreign Application Priority Data

Mar. 21, 2019 (KR) .......................... 10-2019-0032256

(51) Int. Cl.
| | | |
|---|---|---|
| *H01L 23/528* | (2006.01) | |
| *H01L 27/11524* | (2017.01) | |
| *H01L 27/11556* | (2017.01) | |
| *H01L 27/11582* | (2017.01) | |
| *H01L 23/522* | (2006.01) | |
| *H01L 27/1157* | (2017.01) | |
| *G11C 11/24* | (2006.01) | |

(Continued)

(52) U.S. Cl.
CPC .......... *H01L 23/5286* (2013.01); *G11C 11/24* (2013.01); *H01L 23/5223* (2013.01); *H01L 23/5226* (2013.01); *H01L 23/5283* (2013.01); *H01L 27/1157* (2013.01); *H01L 27/11524* (2013.01); *H01L 27/11556* (2013.01); *H01L 27/11565* (2013.01); *H01L 27/11573* (2013.01); *H01L 27/11582* (2013.01)

(58) Field of Classification Search
CPC ......... H01L 27/11524; H01L 27/11556; H01L 27/1157; H01L 27/11568; H01L 27/0629; H01L 29/94; H01L 23/5226; H01L 23/5223; G11C 11/24
See application file for complete search history.

(56) References Cited

U.S. PATENT DOCUMENTS

| | | |
|---|---|---|
| 9,136,268 B2 | 9/2015 | Oh |
| 9,639,650 B2 | 5/2017 | Yuan |

(Continued)

FOREIGN PATENT DOCUMENTS

| | | |
|---|---|---|
| KR | 10-2011-0002180 A | 1/2011 |
| KR | 10-2017-0113882 A | 10/2017 |

*Primary Examiner* — Jose R Diaz

(57) ABSTRACT

A semiconductor device includes a substrate provided with a decoupling capacitor and plurality of circuit elements disposed along a first direction, and a plurality of first wiring line patterns disposed in a first wiring line layer over the substrate, including a power routing pattern coupled to the decoupling capacitor and a plurality of internal wiring line patterns coupled to the plurality of circuit elements. The plurality of first wiring line patterns extend in the first direction, and are aligned in conformity with virtual wiring line pattern tracks which are defined at a first pitch along a second direction intersecting the first direction and parallel to the substrate.

20 Claims, 19 Drawing Sheets

(51) Int. Cl.
*H01L 27/11573* (2017.01)
*H01L 27/11565* (2017.01)

(56) References Cited

U.S. PATENT DOCUMENTS 10,573,659 B2   2/2020   Oh
11,081,446 B2 * 8/2021   Jang .................... H01L 27/1157

\* cited by examiner

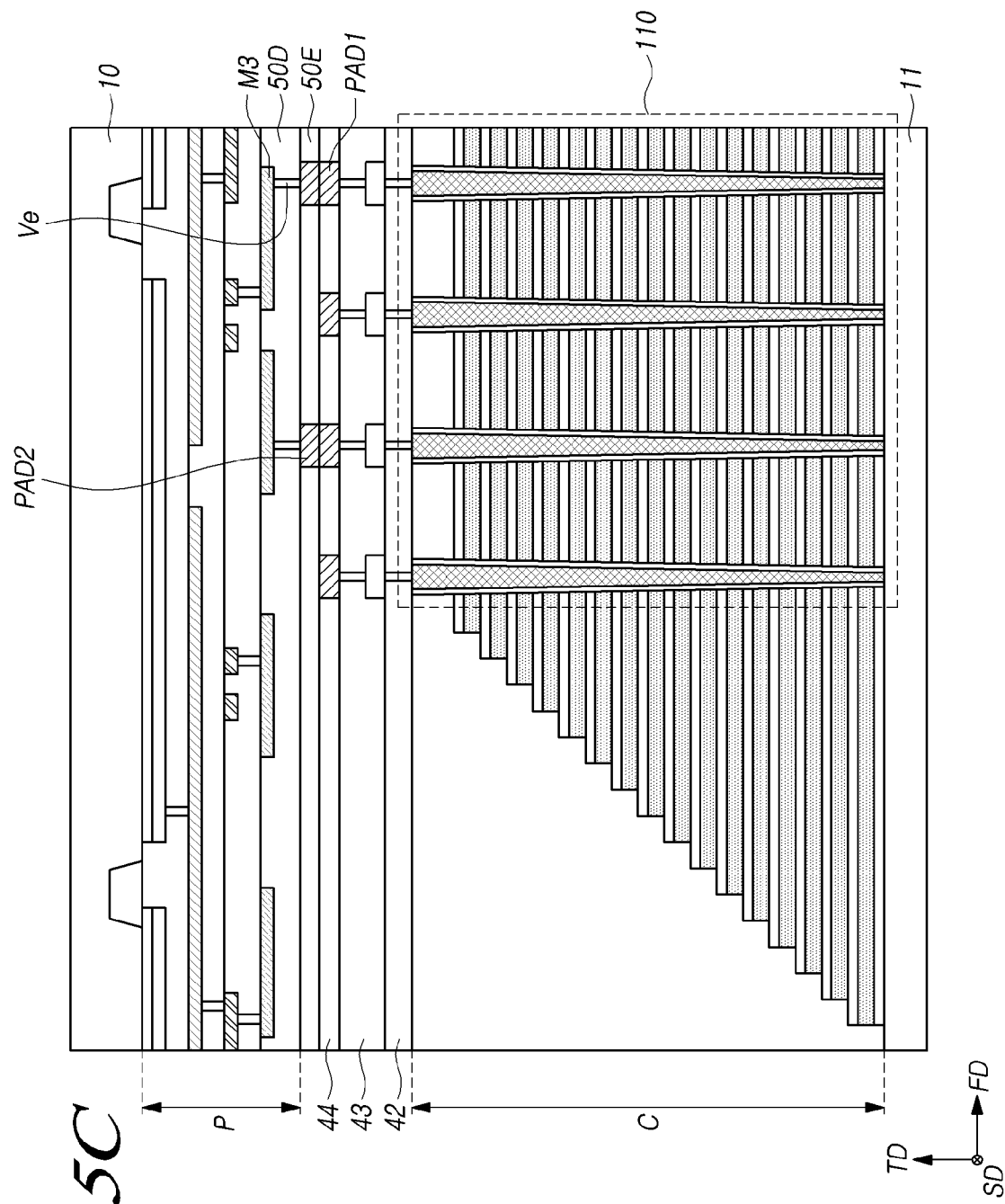

000

SEMICONDUCTOR DEVICE

CROSS-REFERENCE TO RELATED APPLICATION

The present application is a continuation application of a U.S. patent application Ser. No. 16/598,812, filed on Oct. 10, 2019, which claims priority under 35 U.SC. § 119 from Korean Patent Application No. 10-2019-0032256 filed in the Korean Intellectual Property Office on Mar. 21, 2019, the entire content of which is incorporated herein by reference in its entirety.

BACKGROUND

1. Technical Field

Various embodiments generally relate to a semiconductor device, and more particularly, to structures for semiconductor circuit devices.

2. Related Art

As electronic semiconductor technology continues to evolve, the level of requirements for the characteristics of semiconductor devices are gradually increasing. For example, as components of semiconductor devices, such as semiconductor memory devices, continue to shrink, requirements for greater operating speed has also increased. However, in order to perform at greater speed, greater reliability is also needed. As the operating speeds of these semiconductor devices increase, the ability to provide extremely stable power supply for these devices are also needed in order to ensure that these devices operate efficiently. Unfortunately, conventional semiconductor devices are often unable to provide such stable power. Due to this fact, it is difficult to ensure the reliability of these semiconductor devices. Therefore, there is a need for a way to stabilize the power levels of semiconductor devices.

SUMMARY

A semiconductor device is disclosed herein that includes a plurality of active patterns defined in a substrate; gate patterns extending in a first direction while traversing the active patterns; and first wiring line patterns disposed over a first dielectric layer which covers the gate patterns, and extending in the first direction. The first wiring line patterns comprise internal wiring line patterns coupled with first vertical vias which pass through the first dielectric layer and are coupled to the active patterns and the gate patterns; and power routing patterns not coupled with the first vertical vias. The first wiring line patterns are aligned in conformity with virtual wiring line pattern tracks which are defined at a first pitch along a second direction intersecting with the first direction, and the first active patterns are disposed between the power routing patterns when viewed on a top.

A semiconductor device is disclosed herein that includes a substrate defined with a block region and a decoupling capacitor region in a first direction; circuit elements including a plurality of first active patterns which are defined in the substrate within the block region and first gate patterns which extend in the first direction while traversing the first active patterns; a decoupling capacitor including a second active pattern which is defined within the decoupling capacitor region of the substrate and a second gate pattern over the second active pattern; and first wiring line patterns disposed over a first dielectric layer which covers the circuit elements and the decoupling capacitor, and extending in the first direction. The first wiring line patterns comprise internal wiring line patterns coupled with first vertical vias which pass through the first dielectric layer over the first active patterns and the first gate patterns; and power routing patterns not coupled to the first vertical vias. The power routing patterns extend from the block region to the decoupling capacitor region, and are electrically coupled to any one of the second active pattern and the second gate pattern, and wherein the first wiring line patterns are aligned in conformity with virtual wiring line pattern tracks which are defined at a first pitch in a second direction intersecting with the first direction, and the first active patterns do not overlap with the power routing patterns when viewed on a top.

A semiconductor device is disclosed herein that includes a first substrate, and a logic structure defined over the first substrate; and a second substrate, and a memory cell array defined over the second substrate. The logic structural comprise a plurality of active patterns defined in the first substrate; gate patterns extending in a first direction while traversing the active patterns; and first wiring line patterns disposed over a first dielectric layer which covers the gate patterns, and extending in the first direction. The first wiring line patterns comprise internal wiring line patterns coupled with first vertical vias which pass through the first dielectric layer and are coupled to the active patterns and the gate patterns; and power routing patterns not coupled with the first vertical vias. The first wiring line patterns are aligned in conformity with virtual wiring line pattern tracks which are defined at a first pitch in a second direction intersecting with the first direction, and the first active patterns are disposed between the power routing patterns when viewed on a top.

BRIEF DESCRIPTION OF THE DRAWINGS

FIG. 15C is a cross-sectional view of an example semiconductor memory device that includes the memory structure and the logic structure illustrated in FIGS. 15A and 15B.

DETAILED DESCRIPTION

Figure 1:
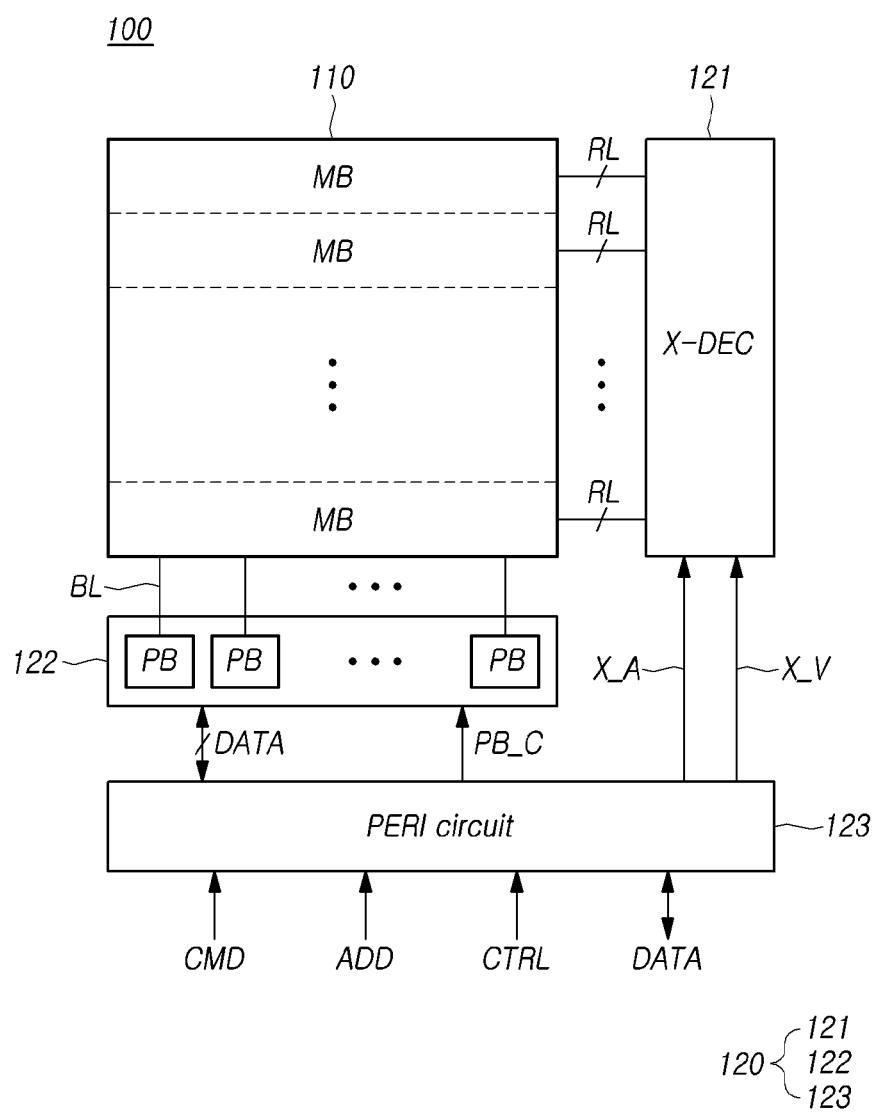
FIG. 1 illustrates a block diagram of memory device in accordance with an embodiment of the present disclosure.

In the following description, certain specific details are set forth in order to provide a thorough understanding of various embodiments of the disclosure. However, upon reviewing this disclosure one skilled in the art will understand that the disclosure may be practiced without many of these details. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, references are made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Accordingly, the following detailed description is not to be taken in a limiting sense, and the scope of embodiments is defined by the appended claims and their equivalents.

In the following description, various perspective-based descriptions such as parallel/perpendicular, top/bottom, above/below, inside/outside, over/under, in/out, and the like may be used. Such descriptions are merely used to facilitate the discussion and are not intended to restrict the application of embodiments described herein to any particular orientation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. At times, the term "electrically coupled," along with its derivatives, may be used herein. As one of ordinary skill in the art will recognize, such terms may mean conductively coupled.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

One or more embodiments of the present disclosure are directed to semiconductor devices that employ decoupling capacitors to ensure that components of the devices are provided with stable power. In order to ensure that a decoupling capacitor operates in a reliable manner, one or more supplemental wiring lines may be added to additionally connect the decoupling capacitor to power sources (e.g., power supply voltage and ground voltage) at different locations of the decoupling capacitor.

Decoupling capacitors are well-known and are commonly used to, for example, decouple one part of an electrical circuit from another. Noise caused by circuit elements may be shunted through the capacitor, reducing the effect of these circuit elements on the rest of the circuit. For example, one way to use decoupling capacitors is for stabilizing and compensating for at least temporary power disruptions of electrical circuits.

In order to provide additional wiring lines, various approaches may be employed in order to ensure that there is sufficient space in the semiconductor device structure to accommodate the additional lines. For example, components of semiconductor devices, such as semiconductor memory devices, are typically formed on a substrate, with wiring line layers located above the substrate for electrically connecting the components (e.g., transistors, capacitors, etc.) to each other as well as to power sources. The wiring lines located on the wiring line layers are usually formed directly aligned and parallel over the components that they are electrically coupled to. In some embodiments, in order to ensure that there will be sufficient space for adding additional wiring in one of the wiring line layers, one or more dummy gate patterns may be placed between circuit components, such as between two transistors, of the semiconductor device structure to ensure that there is sufficient space in at least one of the wiring line layers above the circuit components to accommodate for one or more additional wiring lines that will additionally connect the decoupling capacitor of the semiconductor device structure to power source[s] such as power supply voltage or ground voltage.

In some cases, by adding additional wiring lines, as well as associated vias to connect the decoupling capacitor to power source[s], one or more additional decoupling capacitor may be formed in the vicinity of the "main" decoupling capacitor supplementing the main decoupling capacitor. In some embodiments, in order to ensure space for additional power wiring lines, the other wiring line as well as other components such as gate patterns of transistors, may be formed in selective locations according to virtual tracks (e.g., wiring line pattern tracks and gate pattern tracks) as will be further described herein.

In some embodiments, in order to provide additional conductive paths to power (e.g., power supply voltage and/ground voltage) one or more additional power lines may be disposed directly over the decoupling capacitor in the semiconductor structure. By placing the additional power lines close to the decoupling capacitor, resistance components of the additional conductive paths may be reduced, minimizing voltage drop that occur in the conductive paths.

As will be further described herein, in various embodiments the semiconductor devices to be described herein may be the logic devices of memory devices.

FIG. 1 is a block diagram of a semiconductor device 100 in accordance with an embodiment. As illustrated, the semiconductor device 100 includes a memory cell array 110 and a logic circuit 120. As further illustrated, the logic circuit 120 may include a row decoder 121, a page buffer circuit 122 and a peripheral (PERI) circuit 123.

In various embodiments, the memory cell array 110 may include a plurality of memory blocks MB. Each of the memory blocks MB may include a plurality of memory cells. Each memory cell may be accessed by a row line RL and a bit line BL. In some embodiments, each memory cell may be a volatile memory cell, which may lose data stored therein whenever the power supply to the memory cell is interrupted. Alternatively, each memory cell may be a non-volatile memory cell, which retains data stored therein even when the power supply to the memory cell is interrupted. Note that although the semiconductor device 100 to be described herein will be described as a vertical NAND flash device, it is to be understood that the technical idea of the disclosure is not limited thereto.

The row decoder 121 may be coupled to the memory cell array 110 through row lines RL. In various embodiments, the row lines RL may include at least one drain select line, a plurality of word lines and at least one source select line. The row decoder 121 may be configured to select one of the memory blocks MB of the memory cell array 110 based, for example, on a row address X_A. The row decoder 121 may further transfer an operating voltage X_V from the peripheral circuit 123, for example, a program voltage (Vpgm), a pass voltage (Vpass) and a read voltage (Vread), to row lines RL which are coupled to a selected memory block.

In various embodiments, the page buffer circuit 122 may be coupled to the memory cell array 110 through bit lines BL. The page buffer circuit 122 may include a plurality of page buffers PB which are respectively coupled to the bit lines BL. In some cases, the page buffer circuit 122 may receive a page buffer control signal PB_C from the peripheral circuit 123, and may transmit and receive a data signal DATA to and from the peripheral circuit 123. The page buffer circuit 122 may control the bit lines BL which are coupled to the memory cell array 110, in response to receiving the page buffer control signal PB_C from the PERI circuit 123. For example, the page buffer circuit 122 may detect data stored in a memory cell of the memory cell array 110 by sensing the signal of a bit line BL of the memory cell array 110 in response to the page buffer control signal PB_C, and upon detecting the data may transmit the data signal DATA to the peripheral circuit 123. In a write operation, on the other hand, the page buffer circuit 122 may apply a signal to a bit line BL based on the data signal DATA received from the peripheral circuit 123 in response to the page buffer control signal PB_C. As a result, data may be written in a memory cell of the memory cell array 110. As noted, the page buffer circuit 122 may write data in or read data from a memory cell which is coupled to a word line to be activated by the row decoder 121.

In various embodiments, the peripheral circuit 123 may receive a command signal CMD, an address signal ADD and a control signal CTRL from outside the semiconductor device 100, and in response, may exchange data DATA with an external device. The peripheral circuit 123 may output signals for writing data DATA in the memory cell array 110 or reading data DATA from the memory cell array 110. The outputted signals may include, for example, the row address X_A, the page buffer control signal PB_C and so forth, based on the command signal CMD, the address signal ADD and the control signal CTRL. During operation, the peripheral circuit 123 may generate various voltages including the operating voltage X_V, which are required in the semiconductor device 100.

In the accompanying drawings, two directions that are parallel to the top surface of a substrate and intersect with each other are defined as a first direction FD and a second direction SD where the first direction FD is perpendicular to the second direction SD. In cases where the substrate does not have a flat top surface, the first direction FD and the second direction SD are parallel to a plane that is defined by the substrate, where the plane is parallel to at least two longitudinal directions (which may parallel the first direction FD and the second direction SD) of the substrate and that are perpendicular to a third direction FD. As noted, the third direction TD is defined that is perpendicular to the first direction FD and the second direction SD and that may vertically project from a top surface of the substrate or the plane defined by the substrate.

For example, in cases of semiconductor memory devices where a memory cell array is disposed on a substrate, the first direction FD may correspond to the extending direction of word lines, and the second direction SD may correspond to the extending direction of bit lines. The first direction FD and the second direction SD may intersect substantially perpendicularly with each other. In this situation, the third direction TD may correspond to a direction that is perpendicular to a plane extending in the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Figure 2:
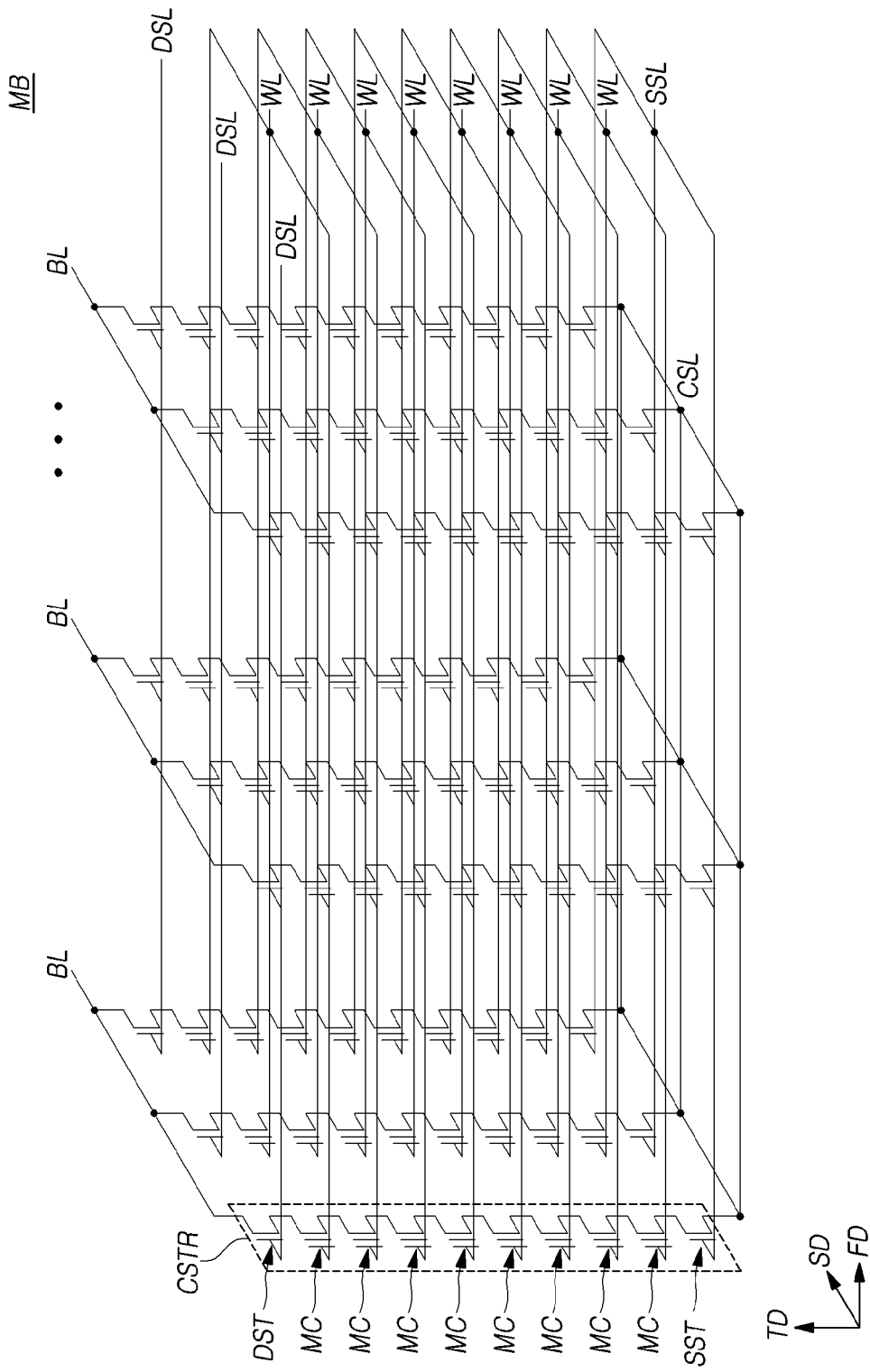
FIG. 2 illustrates an example of one of memory blocks MB illustrated in FIG. 1 in accordance with an embodiment of the present disclosure.

FIG. 2 illustrates an example of one of memory blocks MB illustrated in FIG. 1. As illustrated, a memory block MB may include a plurality of cell strings CSTR which are disposed between and coupled to a plurality of bit lines BL and a common source line CSL. The bit lines BL may extend in the second direction SD, and may be arranged in the first direction FD. A plurality of cell strings CSTR may be coupled in parallel to each of the bit lines BL. The cell strings CSTR may be coupled to the common source line CSL.

Each of the cell strings CSTR may include a drain select transistor DST, which may be coupled to a bit line BL, a source select transistor SST, which is coupled to the common source line CSL, and a plurality of memory cells MC which are disposed between and coupled to the drain select transistor DST and the source select transistor SST. The drain selects transistor DST, the memory cells MC and the source select transistor SST may be coupled in series in the third direction TD.

Drain select lines DSL, a plurality of word lines WL and a source select line SSL may be disposed in the third direction TD between the bit lines BL and the common source line CSL. The drain selects lines DSL, the plurality of word lines WL, and the source select line SSL may correspond to the row lines RL illustrated in FIG. 1. The drain select lines DSL may be coupled to the gates, respectively, of corresponding drain select transistors DST. The word lines WL may be coupled to the gates, respectively, of corresponding memory cells MC. The source select line SSL may be coupled to the gates of source select transistors SST.

Figure 3:
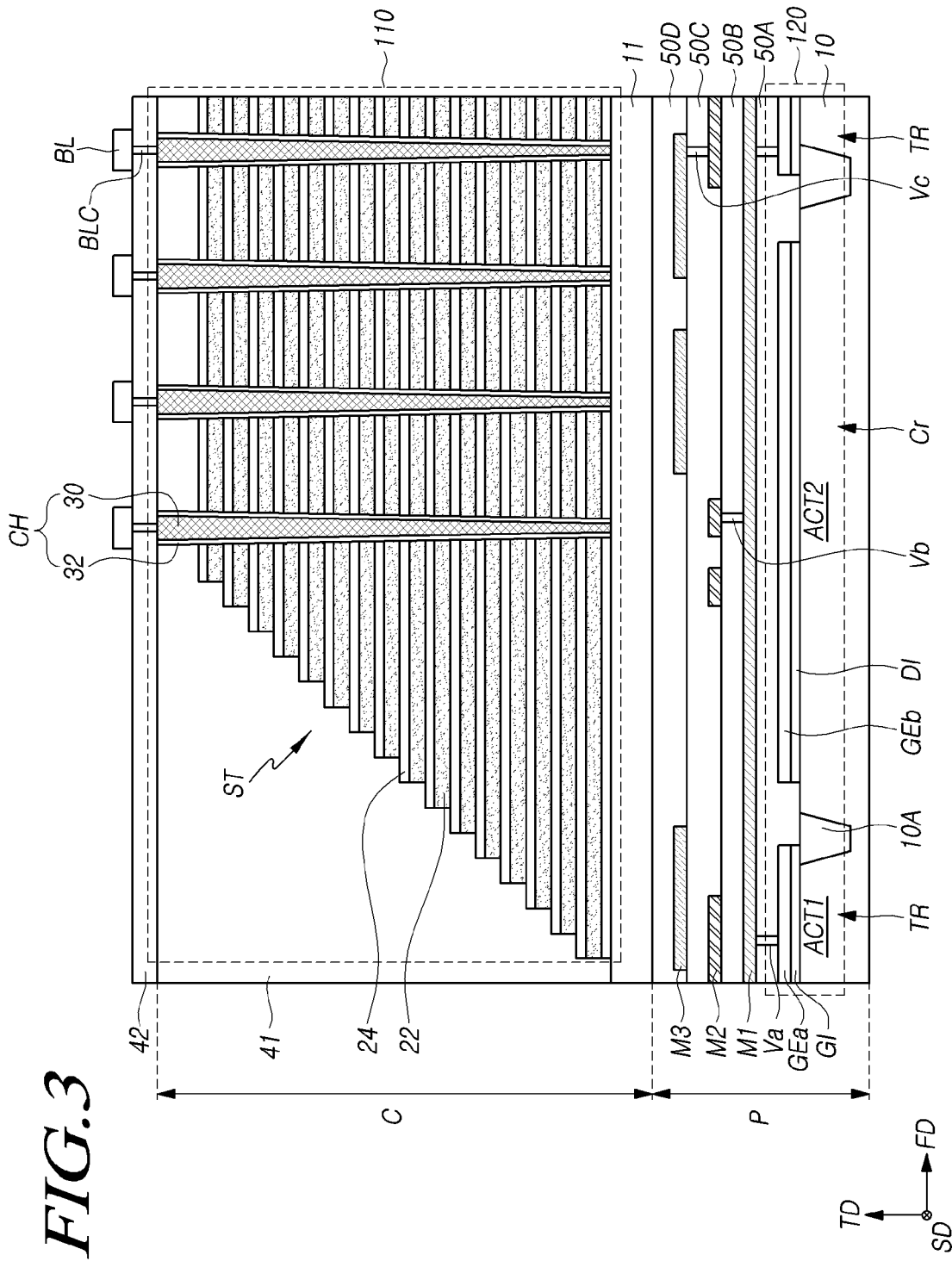
FIG. 3 is a cross-sectional view of an example of a semiconductor memory device in accordance with an embodiment the present disclosure.

FIG. 3 is a cross-sectional view of an example of a semiconductor memory device in accordance with an embodiment. In some embodiments, the semiconductor device may have a PUC (peri under cell) structure in which a logic structure P including a logic circuit 120 may be disposed under a memory structure C including a memory cell array 110.

Although the example semiconductor memory device illustrated in FIG. 3 is an embodiment of a semiconductor memory device where the logic structure P is disposed under the memory structure C, in an alternative embodiment, the logic structure P may be disposed over the memory structure C. When the semiconductor memory device has such a configuration, it may be referred as having a POC (peri over cell) structure. A semiconductor device of a POC structure will be described later with reference to FIGS. 15A to 15C.

As illustrated, the logic structure P includes a first substrate 10. Meanwhile, the memory structure C may include a second substrate 11 and the memory cell array 110 which is disposed on the second substrate 11. In some embodiments, the second substrate 11 may be formed as a polycrystalline silicon layer. The memory cell array 110 may include a plurality of electrode layers 22 and a plurality of dielectric layers 24 which are alternately stacked on the second substrate 11, and a plurality of channel structures CH which vertically pass through the electrode layers 22 and the dielectric layers 24. The electrode layers 22 may correspond to the row lines RL described above with reference to FIG. 1. Among the electrode layers 22, at least one of the lowermost electrode layers 22 may be used as a source select line, and at least one of the uppermost electrode layers 22 may be used as a drain select line. The electrode layers 22 between the source select line and the drain select line may be used as word lines.

In various embodiments, the electrode layers 22 may include a conductive material. For example, the electrode layers 22 may comprise of a doped semiconductor (e.g., doped silicon), a metal (e.g., tungsten, copper or aluminum), a conductive metal nitride (e.g., a titanium nitride or a tantalum nitride) and a transition metal (e.g., titanium or tantalum). On the other hand, the dielectric layers 24 may include a dielectric material such as, for example, silicon oxide.

Each of the electrode layers 22 of the memory cell array 110 may have an exposed pad region which is not covered by the electrode layers 22 positioned thereon. That is, and as illustrated in FIG. 3, the memory cell array 110 may have a step structure ST which may create the pad regions of the electrode layers 22. For example, the step structure ST may be disposed at a periphery of the memory cell array 110 in the first direction FD. The step structure ST may have a step shape which descends in the first direction FD. While not illustrated, a contact may be disposed on the pad region of each of the electrode layers 22, and each of the electrode layers 22 may be electrically coupled to a top wiring line through a contact, the top wiring line being formed or placed on the memory cell array 110.

Each of the channel structures CH may include a channel layer 30 and a gate dielectric layer 32. The channel layer 30 may include polysilicon or monocrystalline silicon, and may include a p-type impurity such as boron (B) in some regions. The channel layer 30 may have the shape of a pillar or a solid cylinder which is completely filled up in its center in some embodiments. Although not shown, in alternative embodiments, the channel layer 30 may have the shape of a tube of which center region is open. In this case, a buried dielectric layer may be formed in the open center region (e.g., an open channel or cavity) of the channel layer 30.

In various embodiments, the gate dielectric layer 32 may have the shape of a straw or a cylindrical shell that is disposed on the outer wall of the channel layer 30. While not illustrated, the gate dielectric layer 32 may include a tunnel dielectric layer, a charge storage layer and a blocking layer which are sequentially stacked from the outer wall of the channel layer 30. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or polysilicon doped with an impurity. The blocking layer may include a single layer or a stack layer of a silicon oxide, a silicon nitride, a hafnium oxide, an aluminum oxide, a zirconium oxide and a tantalum oxide. In some embodiments, the gate dielectric layer 32 may have an ONO (oxide-nitride-oxide) stack structure in which an oxide layer, a nitride layer and an oxide layer are sequentially stacked.

In various embodiments, the electrode layers 22 may be coupled with the channel structures CH, and thereby, may be used to configure memory cells which are arranged three-dimensionally in the memory structure C.

A first top interlayer dielectric layer 41 may be formed on the second substrate 11, and thereby, may cover the top surfaces and side surfaces of the electrode layers 22 and the dielectric layers 24 and the side surfaces of the channel structures CH. A second top interlayer dielectric layer 42 may be formed on the first top interlayer dielectric layer 41, and thereby, may cover the top surfaces of the channel structures CH. The first and second top interlayer dielectric layers 41 and 42 may include a silicon oxide, for example, an HDP (high density plasma) oxide layer or a TEOS (tetra-ethyl-ortho-silicate) oxide layer.

Bit lines BL may be disposed on the second top interlayer dielectric layer 42. The bit lines BL may extend in the second direction SD, and may be electrically coupled to the channel layers 30 through bit line contacts BLC. The bit line contacts BLC may pass through the second top interlayer dielectric layer 42, and thereby, may couple the bit lines BL and the channel layers 30.

The logic structure P may include a first substrate 10, a logic circuit 120, dielectric layers 50A, 50B, 50C, and 50D and wiring line layers M1, M2, and M3. In some embodiments, the first substrate 10 may define a plane that extends in longitudinal directions (e.g., first direction FD and second direction SD). Note that wiring line layer M1 is disposed in or at the bottom of dielectric layer 50B and on dielectric layer 50A, while wiring line layer M2 is disposed in or at the bottom of dielectric layer 50C and on dielectric layer 50B, and wiring line layer M3 is disposed in or at the bottom of dielectric layer 50D and on dielectric layer 50C. Note that a dielectric layer, as described herein, includes the dielectric material disposed in that dielectric layer as well as other components (e.g., conductive lines, vias, gate patterns, and so forth) that may also be disposed in the dielectric layer.

In some embodiments, the first substrate 10 may include a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic circuit 120 may include a plurality of circuit elements TR and a decoupling capacitor Cr that are disposed on the first substrate 10. In various embodiments, the circuit elements TR may include planar transistors. For these embodiments, a circuit element TR may include at least a portion of a first active region (hereinafter "a first active pattern ACT1"), which may be defined by one or more isolation pattern 10A, a gate dielectric pattern GI, and a first gate pattern GEa, the gate dielectric pattern GI and the first gate pattern being stacked on at least the portion of the first active pattern ACT1. As an n-type or p-type impurity is doped into the first active pattern ACT1 on both sides of the first gate pattern GEa, a source/drain (not shown) may be formed. In various embodiments, the circuit elements TR may constitute the row decoder 121, the page buffer circuit 122 and the peripheral circuit 123 of FIG. 1.

In some embodiments, the decoupling capacitor Cr may be a MOS type capacitor. The decoupling capacitor Cr may include an active region (hereinafter "a second active pattern ACT2") of the first substrate 10, which may be defined by the one or more isolation pattern 10A, a dielectric layer pattern DI which is disposed on the second active pattern ACT2, and a second gate pattern GEb which is disposed on the dielectric layer pattern DI.

In various embodiments, the dielectric layer pattern DI of the decoupling capacitor Cr may be formed through the same process as the gate dielectric layer pattern GI of the circuit element TR, and the second gate pattern GEb of the decoupling capacitor Cr may be formed through the same process as used to form a first gate pattern GEa of a circuit element TR. In various embodiments, the decoupling capacitor Cr may play the role of stabilizing a power level by eliminating high frequency noise in a power supply voltage by acting as an auxiliarily providing a power supply voltage required by the circuit elements TR and excluding an inductance component and the like generated when an external power supply voltage is coupled to the circuit elements TR.

Dielectric layers 50A, 50B, 50C, and 50D may be located on the first substrate 10. Each of the dielectric layers 50A, 50B, 50C, and 50D may include dielectric materials, as well as components (e.g., gate patterns, vias, wiring line patterns, and so forth) located in those layers. For example, dielectric layer 50a may include the various gate patterns (e.g., first gate patterns GEa and second gate pattern GEb) disposed on the substrate 1—as well as the dielectric material that covers the gate patterns. As shown in FIG. 3, the dielectric layers 50A to 50D may be sequentially stacked on the first substrate 10 where the dielectric layer 50A is located on the first substrate 10, the dielectric layer 50B is located on the dielectric layer 50A, and so forth. Each of the first to fourth dielectric layers 50A to 50D may include a silicon oxide, such as for example, an HDP oxide layer or a TEOS oxide layer. The second substrate 11 may be disposed on the fourth dielectric layer 50D as the uppermost layer of the first to fourth dielectric layers 50A to 50D.

As alluded to above, the wiring line layers M1, M2, and M3 may be provided on the first to third dielectric layers 50A to 50C, respectively. The wiring line layers M1, M2, and M3 may include a first wiring line layer M1 on the first dielectric layer 50A and in or at the bottom of the second dielectric layer 50B, a second wiring line layer M2 on the second dielectric layer 50B and in or at the bottom of the third dielectric layer 50C, and a third wiring line layer M3 on the third dielectric layer 50C and in or at the bottom of the fourth dielectric layer 50D.

Each of the wiring line layers M1, M2, and M3 may include a plurality of individual and separate wiring lines. As will be further described herein, electrical paths may be formed between the first wiring line layer M1 and the circuit elements TR, between the first wiring line layer M1 and the decoupling capacitor Cr, and between the wiring line layers M1 to M3 disposed at different dielectric layers by employing vertical vias.

Note that and as will be further illustrated and described herein, in many instances wiring lines that are disposed in wiring layer M1 will be parallel with and align directly above, for example, the circuit elements TR (e.g., the first gate patterns GEa) that they are coupled to. For example, the first gate patterns GEa that are disposed on the first substrate 10 extend in the first direction. Likewise, the wiring lines in the first wiring line layer M1 that are connected to these first gate patterns GEa will also align and be in parallel above their corresponding first gate patterns (e.g., the first gate patterns that they are coupled to) extending in the first direction.

Although FIG. 3 illustrates a logic structure P with three wiring line layers M1, M2, and M3, it is to be noted that the disclosure is not limited thereto. For example, two or at least four wiring line layers may be provided in a logic structure P in alternative embodiments.

In various embodiments, the wiring line layers M1, M2, and M3 may constitute internal wiring line patterns and power routing patterns. The internal wiring line patterns may be coupled to the circuit elements TR. The internal wiring line patterns may include power lines, data input/output lines, signal lines for signal transfer among the circuit elements TR, and so forth. The power routing patterns may be coupled to the decoupling capacitor Cr and may play the role of transferring power to the decoupling capacitor Cr. In various embodiments, the wiring line patterns M1 to M3 may be formed to have properties that avoid a process failure, for example, a hillock, at a maximum temperature (hereinafter, referred to as a 'process critical temperature') in a process for forming the memory structure C or the bit lines BL. In other words, as the material of the wiring line layers M1, M2, and M3, a conductive material which has a heat resistance characteristic at the process critical temperature may be used. In some cases, the wiring line layers M1, M2, and M3 may include a material which has a melting point higher than the process critical temperature, for example, tungsten (W).

Because the wiring line layers M1, M2, and M3 may be formed before forming the memory structure C and the bit lines BL, they may be formed using a material which has a a high melting point, however using such material often means using a material that has high resistivity. Due to the above-described limitation in a manufacturing process, the wiring line layers M1, M2, and M3 may have a resistivity value larger than the bit lines BL. Therefore, if a sufficient number of power routing patterns (that provide power) are not secured, the performance of the decoupling capacitor Cr may deteriorate as power is not sufficiently supplied to the decoupling capacitor Cr, and as a result, the power level of a semiconductor device is likely to be unstable. That is, in order to ensure that a decoupling capacitor is reliably performing to stabilized power fluctuations, it may be desirable to provide to the decoupling capacitor Cr, multiple wiring lines providing supplemental conductive paths to power (e.g., power supply voltage and/or ground voltage).

In various embodiments, the wiring line layer M1 may comprise of internal wiring line patterns (i.e., internal wiring lines) and power routing patterns (e.g., power routing lines). The internal wiring line patterns may be coupled to the circuit elements TR through vias that are disposed in the first dielectric layer 50A. In various embodiments, the internal wiring line patterns may include power lines, data input/output lines, signal lines for signal transfer among the circuit elements TR, and so forth. The power routing patterns may be coupled to the decoupling capacitor Cr and may play the role of transferring power to the decoupling capacitor Cr.

In order to provide sufficient number of conductive paths (e.g., signal lines, power lines, etc.) to circuit elements TR, a number of internal wiring line patterns may be disposed in the first wiring line layer M1, which is the wiring line layer nearest to the circuit elements TR. However, because unused "real estate" in the M1 layer (e.g., on the first dielectric layer 50A) is limited due to the presence of numerous existing wiring lines, adding additional wiring line to provide power (e.g., power supply voltage and ground voltage) to the decoupling capacitor Cr is extremely challenging.

According to various embodiments, a semiconductor device is provided that is able to improve performance of a decoupling capacitor Cr that is incorporated into the semiconductor device structure and that facilitates stabilization of the power level provided to the various component of the semiconductor device structure by increasing the number of wiring lines that provide power to the decoupling capacitor CR. In some embodiments, the semiconductor device structure may be a logic device of, for example, a semiconductor memory device.

Figure 4:
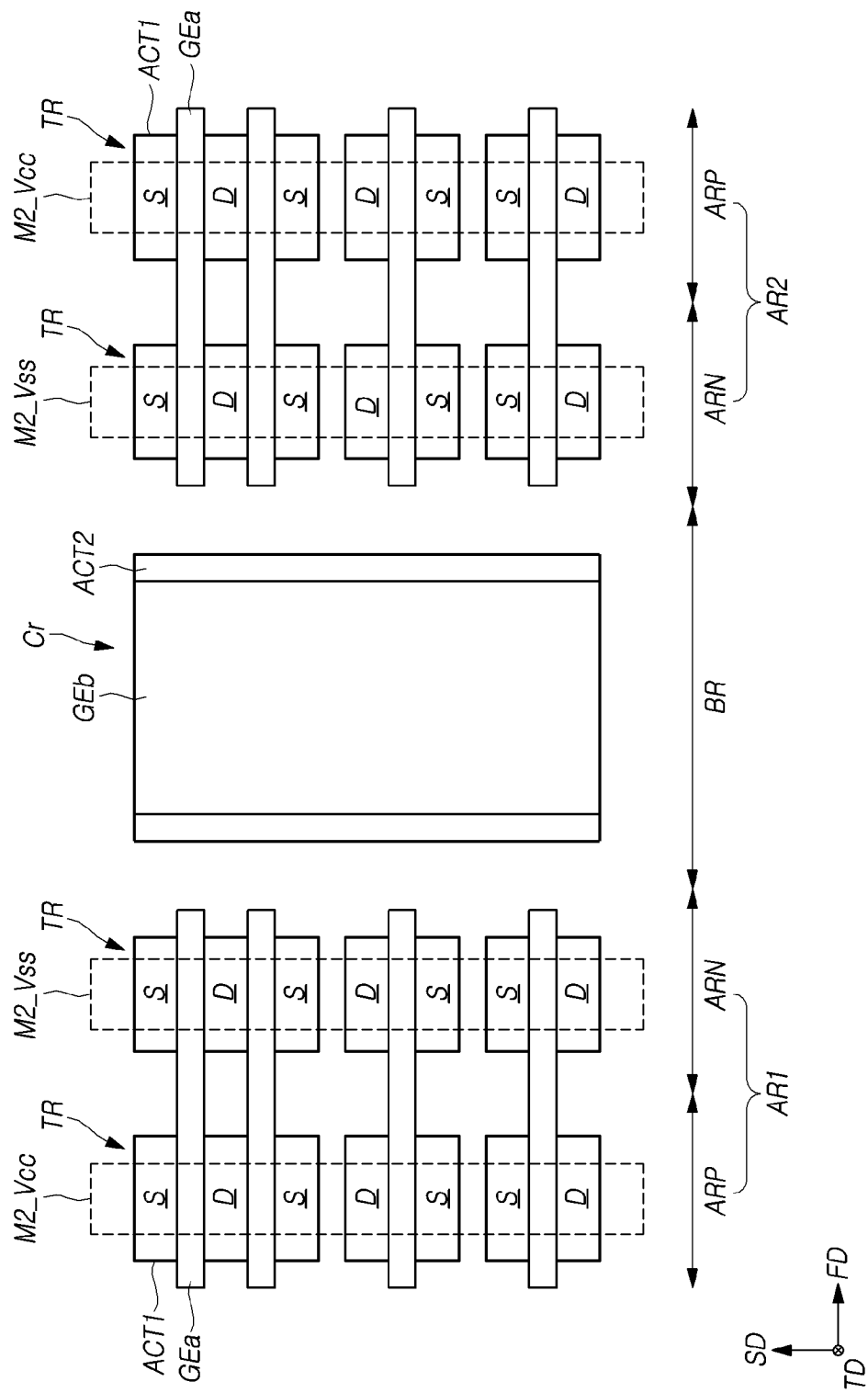
FIG. 4 is an example layout diagram of circuit elements and the decoupling capacitor of the logic structure illustrated in FIG. 3 diagram.
Figure 5:
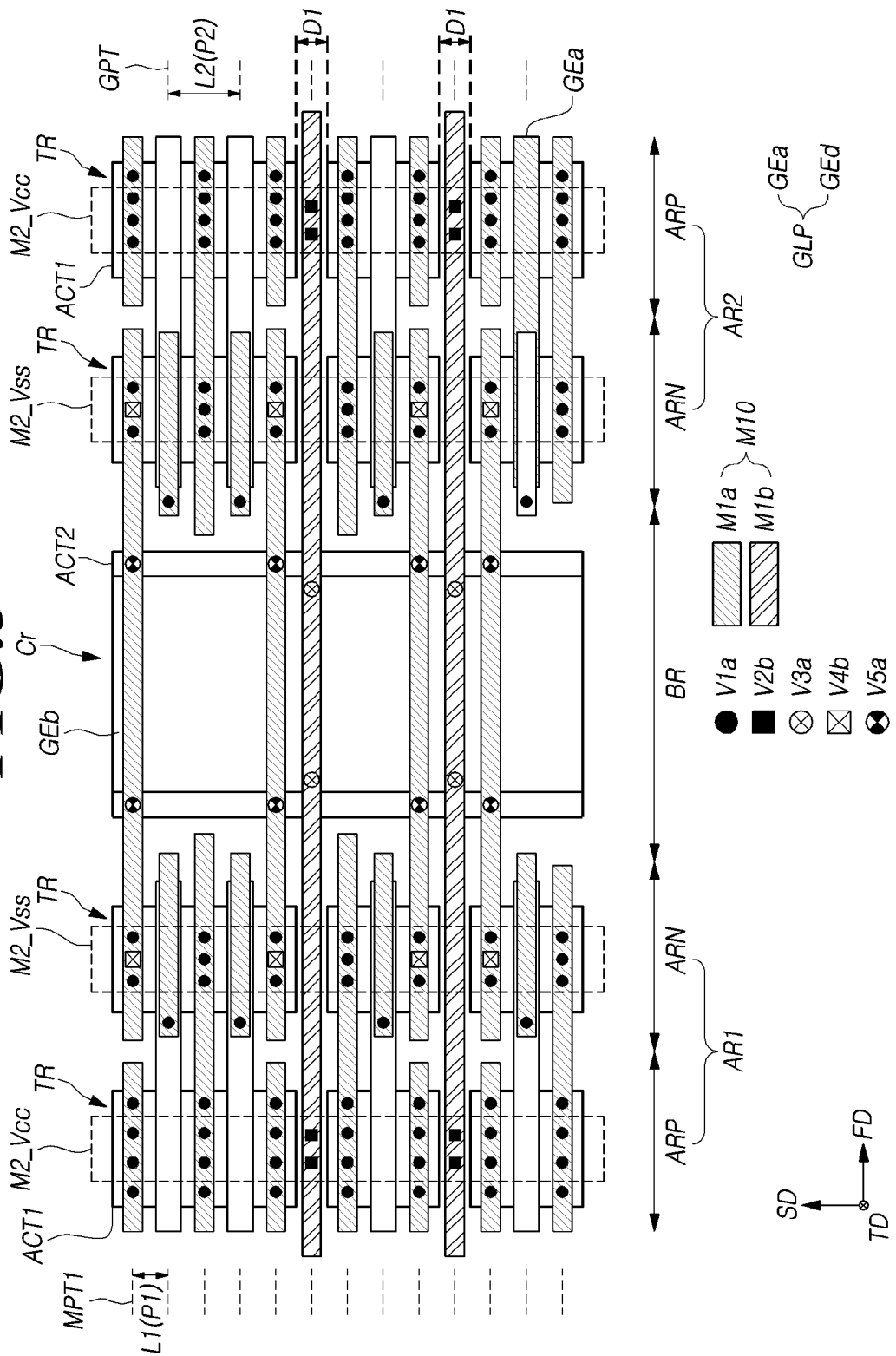
FIG. 5 is an example layout diagram of various components of the logic structure illustrated in FIG. 3.
Figure 6:
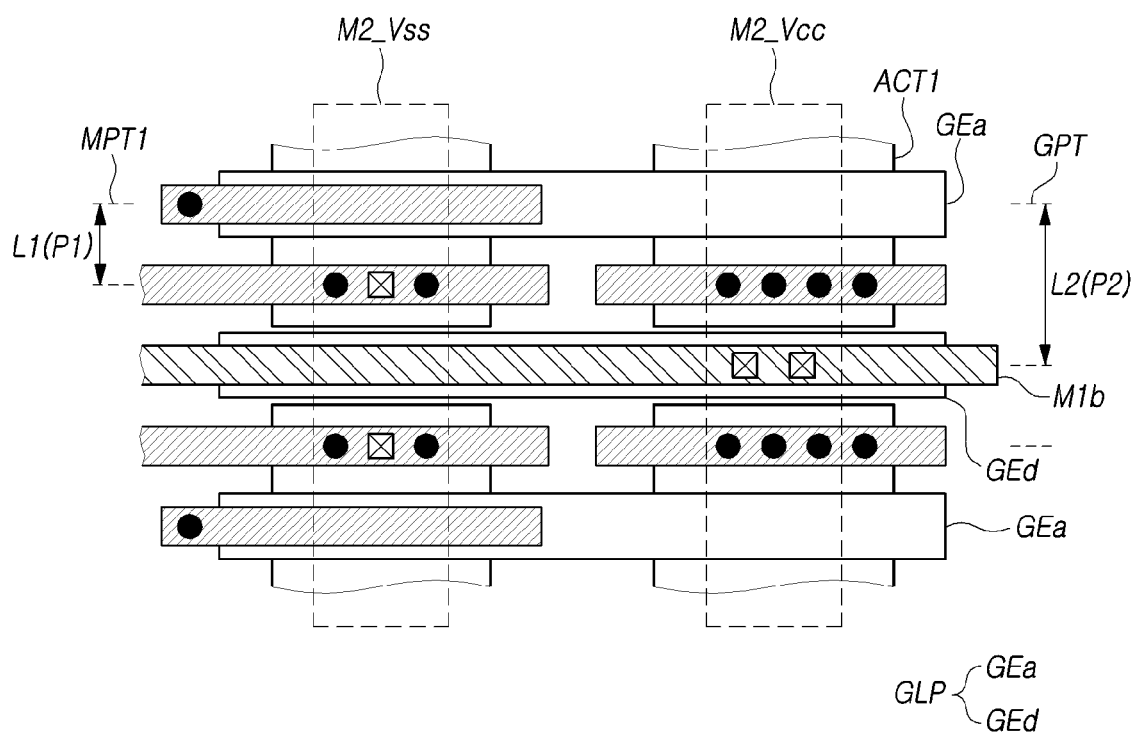
FIG. 6 is another example layout diagram of various components of the logic structure illustrated in FIG. 3.
Figure 7:
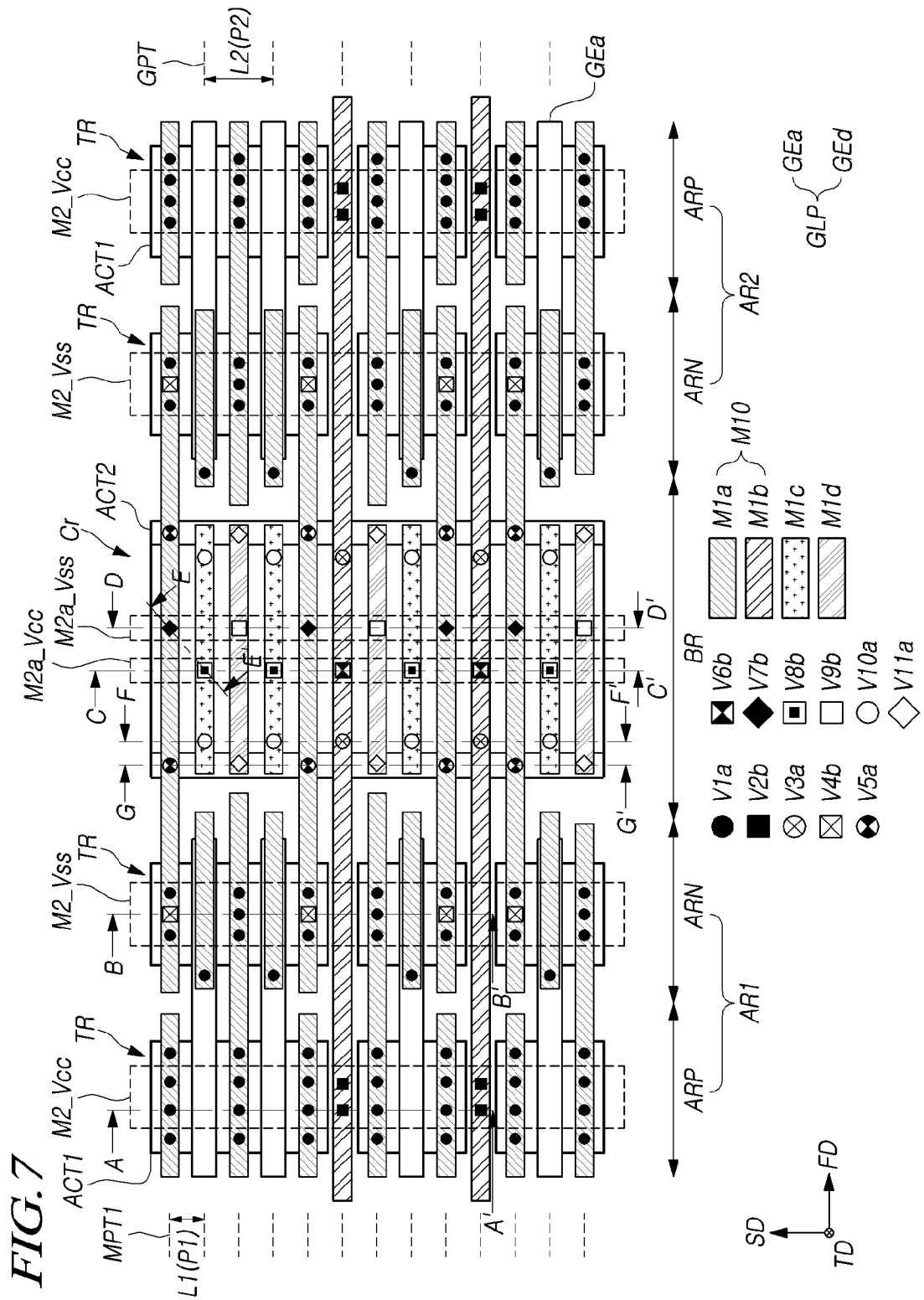
FIG. 7 is another example layout diagram of various components of the logic structure illustrated in FIG. 3.

FIG. 4 is an example layout diagram of the circuit elements TR and the decoupling capacitor Cr of the logic structure P illustrated in FIG. 3. and FIGS. 5 to 7 are example layout diagrams (e.g.., plan views) of various components disposed in various layers of the logic structure P illustrated in FIG. 3. Note that FIG. 4 primarily shows the components (e.g., first active patterns ACT1, source, drain, first gate patterns GEa, etc.) of the circuit elements TR that are disposed at the top surface of the first substrate 10 (see FIGS. 3 and 4), as well as components (e.g., second gate pattern GEb, second active pattern ACT2, and so forth) of the decoupling capacitor Cr that are located at the top surface of the first substrate 10. FIG. 4 shows a first block region AR1 and a second block region AR2 that extend in the second direction SD. A decoupling capacitor region BR may be defined between the first block region AR1 and the second block region AR2. The circuit elements TR may be formed in the first block region AR1 and the second block region AR2, and the decoupling capacitor Cr may be formed in the decoupling capacitor region BR.

Each of the first and second block regions AR1 and AR2 may include a first type block region ARP and a second type block region ARN. The circuit elements TR that are defined/formed in the first type block region ARP may be first conductivity type transistors, and the circuit elements TR that are defined/formed in the second type block region ARN may be second conductivity type transistors. The first conductivity type transistors may be PMOS transistors, and the second conductivity type transistors may be NMOS transistors. The first conductivity type transistors may be p-type metal-oxide semiconductor (PMOS) transistors, and the second conductivity type transistors may be n-type metal-oxide-semiconductor (NMOS) transistors. In each of the first and second block regions AR1 and AR2, the first type block region ARP (e.g., with PMOS transistors) may be disposed further away from the decoupling capacitor region BR than the second type block region ARN (e.g., with NMOS transistors). As illustrated in FIG. 4, the second type block region ARN may be disposed between the first type block region ARP and the decoupling capacitor region BR.

The circuit elements TR (e.g., NMOS and PMOS transistors) may include first active patterns ACT1 (i.e., first active regions), which may be defined by one or more isolation patterns, and first gate patterns GEa. The first active patterns ACT1 disposed in the first type block region ARP may be aligned in the second direction SD. The first active patterns ACT1 disposed in the second type block region ARN may also be aligned in the second direction SD. In each of the first and second block regions AR1 and AR2, the first active patterns ACT1 of the first type block region ARP may be aligned with the first active patterns ACT1 of the second type block region ARN in the first direction FD.

Each of the first gate patterns GEa are parallel to each other and may extend in the first direction FD while traversing (e.g., crossing over) the first active patterns ACT1. The first gate patterns GEa may constitute the gate electrodes of the circuit elements TR, which in some embodiments, may be NMOS and PMOS transistors.

In the first type block region ARP, a first type impurity, for example, a p-type impurity, is implanted into the first active patterns ACT1 on both sides of the first gate patterns GEa. As a result, sources S and drains D of the PMOS transistors may be defined/formed. In the second type block region ARN, a second type impurity, for example, an n-type impurity, is implanted into the first active patterns ACT1 on both sides of the first gate patterns GEa. As a result, sources S and drains D of the NMOS transistors may be defined/formed.

In some embodiments, the decoupling capacitor Cr may be a MOS type capacitor. The decoupling capacitor Cr may include a second active pattern ACT2 (e.g., second active region) which is defined by one or more isolation patterns, and a second gate pattern GEb, which is disposed on or above the second active pattern ACT2. The second gate pattern GEb may be disposed at the same level (e.g., disposed in or at the bottom of the first dielectric layer 50A—see FIG. 3) as the first gate patterns GEa. The second active pattern ACT2 and the second gate pattern GEb may constitute a pair of electrodes, and along with the dielectric layer pattern DI disposed between the second active pattern ACT2 and the second gate pattern GEb together may constitute the decoupling capacitor Cr.

In some embodiments, the decoupling capacitor Cr may be an NMOS type capacitor. In this case, the second active pattern ACT2 (i.e., second active region) may be doped with an n-type impurity. In alternative embodiments, the decoupling capacitor Cr may be a PMOS type capacitor. In this case, the second active pattern ACT2 may be doped with a p-type impurity. Note that in the embodiment illustrated in FIG. 4, the decoupling capacitor Cr is an NMOS type capacitor.

Illustrated in FIG. 4 is an outline (e.g., broken lines) of a first power line M2_Vcc and a second power line M2_Vss that may be disposed at a level higher than the first gate patterns GEa and the second gate pattern GEb. For example, in the embodiment illustrated in FIG. 3, he first power line M2_Vcc and the second power line M2_Vss are located in the wiring line layer M2, which is in or at the bottom of third dielectric layer 50C. In various embodiments, the first power line M2_Vcc (e.g., power supply voltage line) and the second power line M2_Vss (e.g., ground voltage line) may define/comprise the second wiring line layer M2 which is illustrated in FIG. 3. In various embodiments, the first power line M2_Vcc may facilitate transferring of a first power, and the second power line M2_Vss may facilitate transferring of a second power. While it is illustrated in the drawings that the first power is a power supply voltage (Vcc) and the second power is a ground voltage (Vss), it is to be noted that the first power may be a ground voltage (Vss) and the second power may be a power supply voltage (Vcc). The first power line M2_Vcc and the second power line M2_Vss may extend in the second direction SD.

In embodiments where the circuit elements TR which are disposed in the first type block region ARP are PMOS transistors and the circuit elements TR which are disposed in the second type block region ARN are NMOS transistors, the first power line M2_Vcc may be disposed over the first type block region ARP extending in the second direction and the second power line M2_Vss may be disposed over the second type block region ARN extending in the second direction. In each of the first and second block regions AR1 and AR2, the first power line M2_Vcc may be disposed further away from the decoupling capacitor region BR than the second power line M2_Vss.

Referring to FIG. 5, which illustrates the internal wiring line patterns M1a and power routing patterns M1b may be disposed at a level higher (e.g., wiring line layer M1 that is located in or at the bottom of the second dielectric layer 50B) than the first gate patterns GEa and the second gate pattern GEb and lower than the level (e.g., wiring line layer M2 that is located in or at the bottom of the third dielectric layer 50C) that the first power line M2_Vcc and the second power line M2_Vss are located. Note that he internal wiring line patterns M1a and the power routing patterns M1b also be referred to herein as wiring line patterns. As illustrated in FIG. 5, the internal wiring line patterns M1a and the power routing patterns M1b_may parallel each other and may extend in the first direction FD. The internal wiring line patterns M1a and the power routing patterns M1b may be disposed parallel to the first gate patterns GEa.

The internal wiring line patterns M1a may be electrically coupled to the circuit elements TR. The internal wiring line patterns M1a may be power lines for transferring power, such as for example, the power supply voltage (Vcc) and the ground voltage (Vss), to the circuit elements TR. The other internal wiring line patterns M1a may be data input/output lines, signal lines for signal transfer among the circuit elements TR, and so forth.

The power routing patterns M1b may include power lines for transferring power (e.g., power supply voltage or ground voltage) to the decoupling capacitor Cr. As noted earlier, the various wiring lines (e.g., internal wiring line patterns M1a, the power routing patterns M1b, and so forth) may be electrically coupled to various circuit elements TR through vertical vias. For example, disposed on the first gate patterns GEa, the sources S, and the drains D of the circuit elements TR in the first dielectric layer 50A are first vertical vias V1a. Various internal wiring line patterns M1a in the wiring line layer M1 may be coupled to the first gate patterns GEa, the sources S and the drains D through the first vertical vias V1a. In various embodiments, although the power routing patterns M1b are also located in the wiring line layer M1, they may not be coupled to the first vertical vias V1a. Thus, they may not at least directly be coupled to the circuit elements TR.

In various embodiments, a plurality of wiring line pattern tracks MPT1 which extend in the first direction FD and are arranged in the second direction SD may be defined at regular intervals. The wiring line pattern tracks MPT1 may be virtual lines which may be used in disposing the internal wiring line patterns M1a and the power routing patterns M1b. That is, the positions of the internal wiring line patterns M1a and the power routing patterns M1b may be defined by the wiring line pattern tracks MPT1. The distance between a pair of adjacent wiring line pattern tracks MPT1 may be a first distance L1. In various embodiments, the wiring line pattern tracks MPT1 may be arranged in the second direction SD at the first distance L1. The pitch of the wiring line pattern tracks MPT1 may be a first pitch P1, and the first pitch P1 (e.g., a preset pitch) may be the same as the first distance L1.

The internal wiring line patterns M1a and the power routing patterns M1b may be aligned with (e.g., trace) the wiring line pattern tracks MPT1. The center lines of the internal wiring line patterns M1a and the power routing patterns M1b may overlap with (e.g., trace) the wiring line pattern tracks MPT1, respectively. The power routing patterns M1b together with the internal wiring line patterns M1a may define first wiring line patterns M10. In various embodiments, the first wiring line patterns M10 may be formed in the first wiring line layer M1 (see FIG. 3). In some embodiments, a minimum pitch of the first wiring line patterns M10 may be the first pitch P1, and the first pitch P1 may be the same as the first distance L1 as shown in top left side of FIG. 5. In some embodiments, the interval (e.g., the pitch, which may be preset) between the center lines of the first wiring line patterns M10 may be m*P1 (m is a natural number). The size of the first pitch P1 may be determined depending on the degree of miniaturization of a semiconductor device manufacturing process. As used herein, the term 'pitch' or 'minimum pitch' may correspond to the sum of the distance between a pair of adjacent patterns and the width of one pattern.

In various embodiments, second vertical vias V2b may be formed on the power routing patterns M1b (e.g., formed in the second dielectric layer 50B) to electrically couple the power routing patterns M1b to the first power line M2_Vcc that is in the second wiring line layer M2 located in or at the bottom of the third dielectric layer 50C. That is, the first power line M2_Vcc (which is in the wiring line layer M2) is located above and in a higher layer than the power routing patterns M1b (which is in the wiring line layer M1) as shown in FIG. 3. The placement of the second vias V2b in the second dielectric layer 50B on top of the power routing patterns M1b electrically couples the power routing patterns M1b to the first power line M2_Vcc.

In various embodiments, and as illustrated in FIG. 5, the power routing patterns M1b may extend toward and over the decoupling capacitor region BR in the first direction FD. Third vertical vias V3a may be formed between the power routing patterns M1b and the second gate pattern GEb of the decoupling capacitor Cr where they overlap with each other (e.g., where the power routing patterns M1b extends over the second gate pattern GEb). As a result, the power routing patterns M1b may be electrically coupled to the second gate pattern GEb. In various embodiments, the third vertical vias V3a may provide electrical paths for transferring the first power (for example, Vcc) that is loaded to the power routing patterns M1b, to the second gate pattern GEb.

Note that in FIG. 5, there are two power routing patterns M1b that extend across and over the second gate pattern GEb. In the embodiment illustrated in FIG. 5, each of the two power routing patterns M1b are electrically coupled to the second gate pattern GEb through two vertical vias V3a. Note further that although only two power routing patterns M1b are shown to be electrically coupled to the second gate pattern GEb through vertical vias V3a, in alternative embodiments, three or more power routing patterns M1b may be electrically coupled to the second gate pattern GEb.

When viewed from the top (e.g., plan view from the third direction), the first active patterns ACT1 may be aligned such that each of them is positioned between power routing patterns M1b. An interval between first active patterns ACT1 which are adjacent to each other in the second direction SD may be constant as a first interval D1 as shown on the right side of FIG. 5. Each of the power routing patterns M1b may have a width smaller than the first interval D1, and may be disposed within the first interval D1. When viewed from the top (e.g., from the third direction TD), the first active patterns ACT1 may not overlap with the power routing patterns M1b. That is, when the outlines of the power routing patterns M1b, which are located in or at the bottom of the second dielectric layer 50B, are superimposed straight down to the surface of the substrate, the outlines will superimpose between adjacent first active patterns ACT1.

In various embodiments, gate pattern tracks GPT (see FIG. 6) may be set in conformity with adjacent first active patterns ACT1. The gate pattern tracks GPT may be virtual lines, which may be used in forming the first gate patterns GEa. In some embodiments, the gate pattern tracks GPT may be arranged in the second direction SD at a predetermined interval L2. The distance between a pair of adjacent gate pattern tracks GPT may be a second distance L2. The pitch of the gate pattern tracks GPT may be a second pitch P2, which may be preset and which in FIG. 6 is the distance between the center line of first gate pattern GEa and the center one of a power routing pattern M1b.

When the first gate patterns GEa are being formed, they may be realigned such that the center line of each of them overlaps with each of the gate pattern tracks GPT. In some embodiments, a minimum pitch between the first gate patterns GEa may be the second pitch P2, and the second pitch P2 may be the same as the second distance L2. An interval between the center lines of adjacent first gate patterns GEa may be n*P2 (n is a natural number). For example, the interval between the center line of a first first gate pattern GEa and the center line of a second first gate pattern GEa in the first block region AR1 may be 1*P2. The interval between the center line of the second first gate pattern GEa and the center line of a third first gate pattern GEa in the first block region AR1 may be 2*P2. The first vertical vias V1a may also be realigned in conformity with the changed first active patterns ACT1 and first gate patterns GEa.

In various embodiments, the center line of each of the power routing patterns M1b may overlap with (e.g., trace) each of the gate pattern tracks GPT. At the center line of each of the power routing patterns M1b, the gate pattern track GPT and the wiring line pattern track MPT1 may overlap with each other.

Referring back to FIG. 5, fourth vertical vias V4b are formed on the internal wiring line patterns M1a, which are coupled to the sources S of the circuit elements TR through the first vertical vias V1a. The fourth vias V4b may further be electrically coupled to the second power line M2_Vss and may, therefore, electrically couple the internal wiring line patterns M1a and the second power line M2_Vss. The internal wiring line patterns M1a which are coupled to the second power line M2_Vss through the fourth vertical vias V4b may extend toward the decoupling capacitor region BR in the first direction FD, and may overlap or cross over at least partially with the decoupling capacitor Cr.

Fifth vertical vias V5a may be formed where the internal wiring line patterns M1a that are coupled to the second power line M2_Vss overlap or cross over the second active pattern ACT2 of the decoupling capacitor Cr. As a result, the internal wiring line patterns M1a (that are coupled to the second power line M2_Vss) may be electrically coupled to the second active pattern ACT2. The fifth vertical vias V5a may provide electrical paths for transferring the second power (for example, Vss) loaded to the internal wiring line patterns M1a through the second power line M2_Vss, to the second active pattern ACT2.

Note that in FIG. 5, there are four internal wiring line patterns M1a that extend cross and over the second active pattern ACT2. In the embodiment illustrated n FIG. 5, each of the four internal wiring line patterns M1a are electrically coupled to the second active pattern ACT2 through two fifth vertical vias V5a. Note further that although four internal wiring line patterns M1a are shown to be electrically coupled to the second active pattern ACT2 through vertical vias V5a, in alternative embodiments, fewer or more internal wiring line patterns M1a may be electrically coupled to second active pattern ACT2.

Although the power routing patterns M1b are electrically coupled to the first power line M2_Vcc and the second gate pattern GEb, and the internal wiring line patterns M1a are coupled to the second power line M2_Vss and to the second active pattern ACT2 in the illustrated embodiments, opposite coupling may also be possible in various alternative embodiments.

Referring to FIG. 6, which is a close-up view of one of the power routing patterns M1b illustrated in FIG. 5. In order to ensure that there is sufficient space in the wiring line layer M1 (which is in or at the bottom of the second dielectric layer 50B) for forming an additional power routing pattern M1b, a dummy gate pattern GEd may be formed on the substrate 10 between first active patterns ACT1 according to various embodiments. That is, during the fabrication process, many of the wiring lines (e.g., the internal wiring line patterns M1a) in the wiring line layer M1 are typically formed directly above and aligned with the substrate components (e.g., first gate patterns GEa, source S, drain D, etc.) that they are electrically connected to and extending in the first direction. Thus, placing the dummy gate pattern GEd between first active patterns ACT1 may ensure that sufficient space will be present between, for example, two adjacent internal wiring line patterns M1a to form an additional power routing patterns M1b between the adjacent internal wiring line patterns M1a.

As illustrated, the dummy gate pattern in this embodiment is placed centered between two pairs of first active patterns ACT1 as well as two pairs of internal wiring line patterns M1a. The dummy gate pattern GEd may correspond to a dummy structure that does not exert any influence on the operation of the semiconductor device. Accordingly, in some embodiments, the dummy gate pattern Ged may be made of a dielectric material such as silicon oxide. The dummy gate pattern GEd may be disposed on the substrate 10 (e.g., at the same level as the first gate patterns GEa) and may extend in the first direction FD. For these embodiments, the dummy gate pattern GEd may be parallel to the first gate patterns GEa.

The dummy gate pattern GEd may be aligned with (e.g., trace) a gate pattern track GPT. The center line of the dummy gate pattern GEd may overlap with (e.g., align with or under) one of the gate pattern tracks GPT. The center line of the dummy gate pattern GEd may overlap with (e.g., align under) one of the wiring line pattern tracks MPT1 (see FIG. 5). The center line of the dummy gate pattern GEd may overlap with the center line of one of the power routing patterns M1$b$.

Dummy gate patterns GEd together with the first gate patterns GEa may constitute gate line patterns GLP. By forming the dummy gate patterns GEd, it is possible to uniformly maintain the distribution of the gate line patterns GLP. Thus, as non-uniformity in process due to a difference in the density of patterns is eliminated, it is possible to suppress a failure from occurring in the first gate patterns GEa during a manufacturing process.

Referring to FIG. 7, which illustrates some if not all of the components of the first, second, and third dielectric layer 50A, 50B, and 50C according to various embodiments. In some embodiments, an additional first power line M2$a$_Vcc (e.g., an additional power supply voltage line) and an additional second power line M2$a$_Vss (e.g., an additional ground voltage line) may be additionally provided above the decoupling capacitor Cr. The additional first power line M2$a$_Vcc and the additional second power line M2$a$_Vss may be disposed at the same level (e.g., the wiring line layer M2 disposed in or at the bottom of dielectric layer 50C) as the first power line M2_Vcc and the second power line M2_Vss, and may extend in the second direction SD. The first power line M2_Vcc, the second power line M2_Vss, the additional first power line M2$a$_Vcc and the additional second power line M2$a$_Vss in some embodiments may constitute the second wiring line layer M2, which is disposed in or at bottom of the third dielectric layer 50C (e.g., within the third dielectric layer or at the bottom of the third dielectric layer, but not underneath the first dielectric layer—see FIG. 3).

The additional first power line M2$a$_Vcc may cross over the power routing patterns M1$b$ (note that the additional first power line M2$a$_Vcc may be disposed in wiring line layer M2 while power routing patterns M1$b$ are disposed in wiring line layer M1) in the second direction SD. Sixth vertical vias V6$b$ may be formed at intersections of the additional first power line M2$a$_Vcc and the power routing patterns M1$b$ where the additional first power line M2$a$_Vcc crosses over the power routing patterns M1$b$ in the second direction. As a result, the additional first power line M2$a$_Vcc may be electrically coupled to the two power routing patterns M1$b$ illustrated in FIG. 7 through vias V6$b$.

The additional second power line M2$a$_Vss may cross over the internal wiring line patterns M1$a$ in the second direction, which may be coupled to the second power line M2_Vss through via V1$a$. The seventh vertical vias V7$b$ may be formed between the internal wiring line patterns M1$a$ and the additional second power line M2$a$_Vss where the internal wiring line patterns M1$a$ pass underneath the additional second power line M2_Vss. As a result, the internal wiring line patterns M1$a$ may be electrically coupled to both the second power line M2_Vss and the additional second power line M2$a$_Vss.

In various embodiments, first power strap lines M1$c$ and second power strap lines M1$d$ may be provided at the same level as the internal wiring line patterns M1$a$ and the power routing patterns M1$b$, that is, at the first wiring line layer M1. For these embodiments, the first power strap lines M1$c$ and the second power strap lines M1$d$ may be disposed over the decoupling capacitor Cr in the third direction. The first power strap lines M1$c$ and the second power strap lines M1$d$ may extend in the first direction FD. In various embodiments, the first power strap lines M1$c$ and the second power strap lines M1$d$ may be aligned with (e.g., trace) the wiring line pattern tracks MPT1. The center lines of the first power strap lines M1$c$ and the second power strap lines M1$d$ may overlap with the wiring line pattern tracks MPT1, respectively.

The first power strap lines M1$c$ may be electrically coupled to the additional first power line M2$a$_Vcc through eighth vertical vias V8$b$, and the second power strap lines M1$d$ may be electrically coupled to the additional second power line M2$a$_Vss through ninth vertical vias V9$b$.

The first power strap lines M1$c$ may be electrically coupled to the second gate pattern GEb of the decoupling capacitor Cr through tenth vertical vias V10$a$, and the second power strap lines M1$d$ may be electrically coupled to the second active pattern ACT2 of the decoupling capacitor Cr through eleventh vertical vias V11$a$. Although it is illustrated in the present embodiment that the first power strap lines M1$c$ are electrically coupled to the second gate pattern GEb of the decoupling capacitor Cr and the second power strap lines M1$d$ are electrically coupled to the second active pattern ACT2 of the decoupling capacitor Cr, it is to be noted that opposite coupling is also possible.

Figure 8:
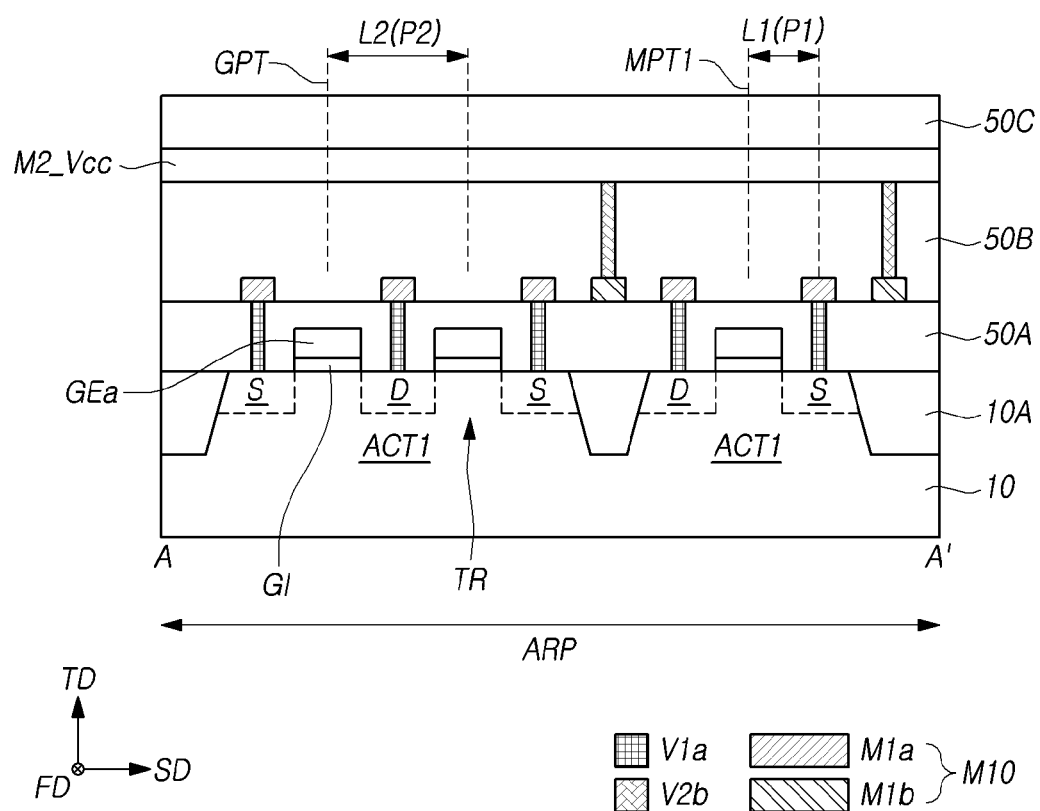
FIG. 8 is a cross-sectional view taken along the line A-A' of FIG. 7.
Figure 9:
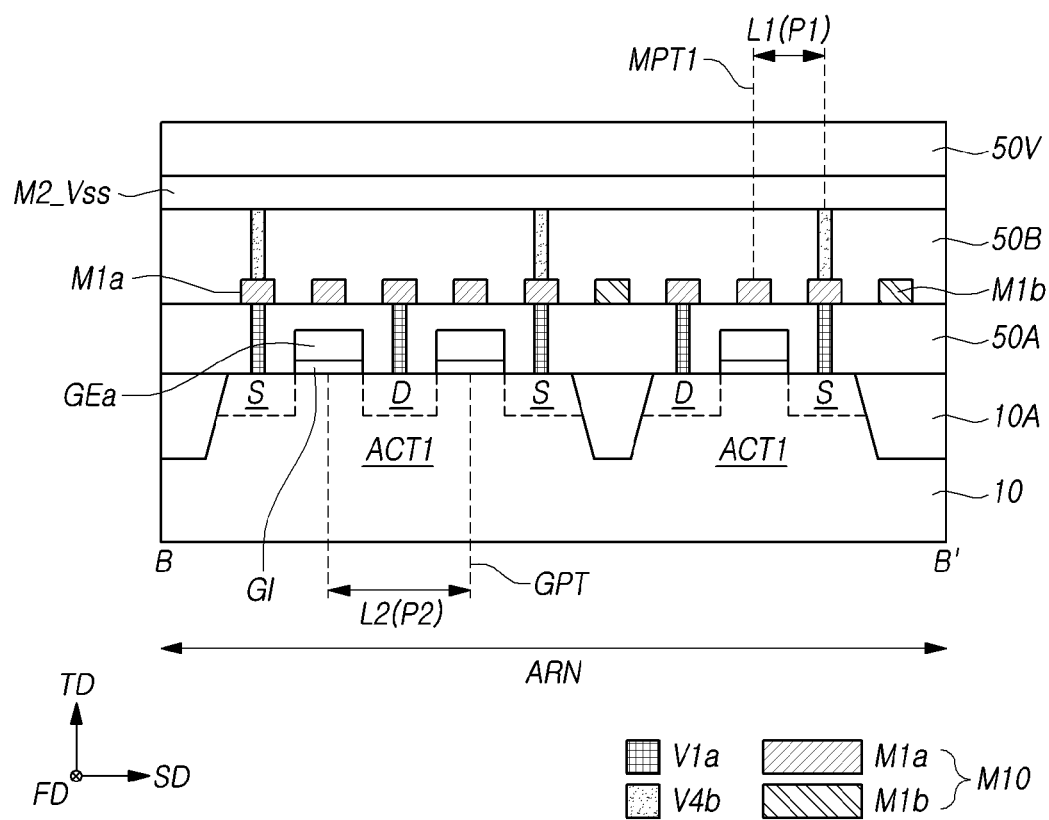
FIG. 9 is a cross-sectional view taken along the line B-B' of FIG. 7.
Figure 10:
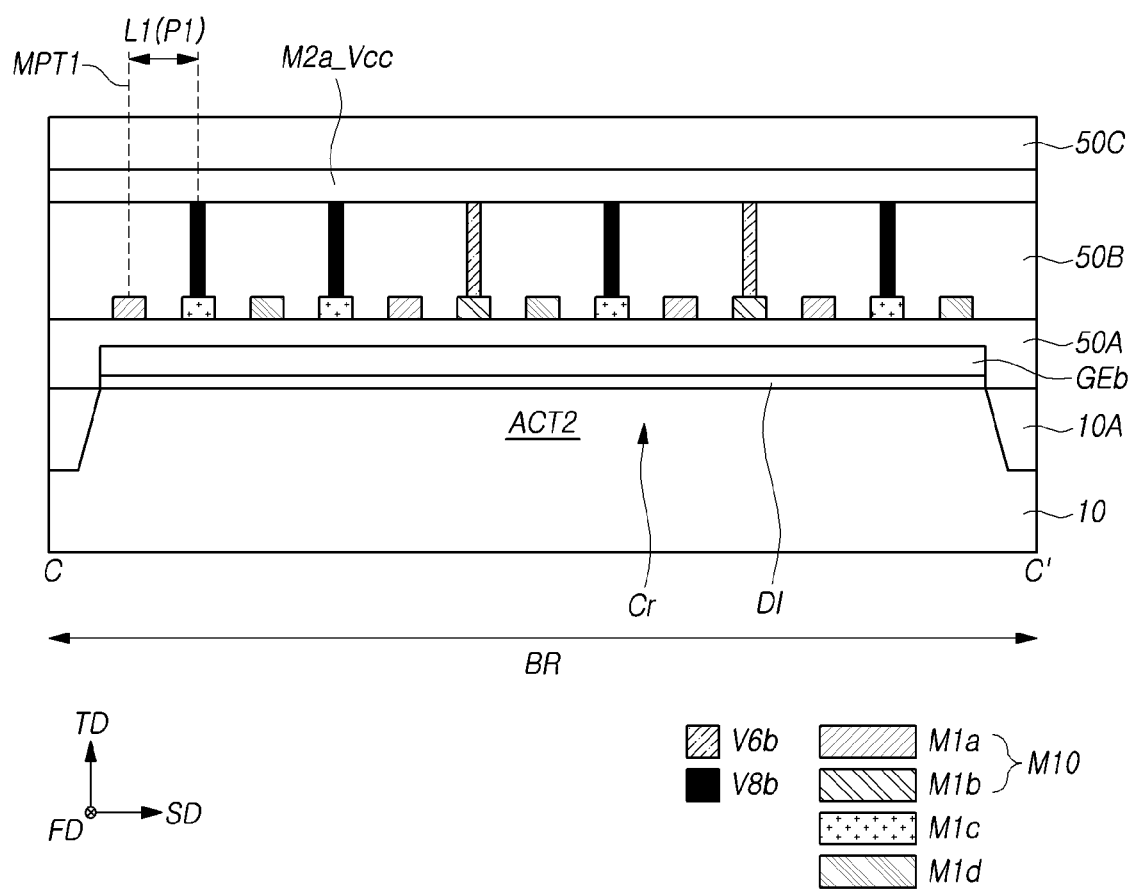
FIG. 10 is a cross-sectional view taken along the line C-C' of FIG. 7.
Figure 11:
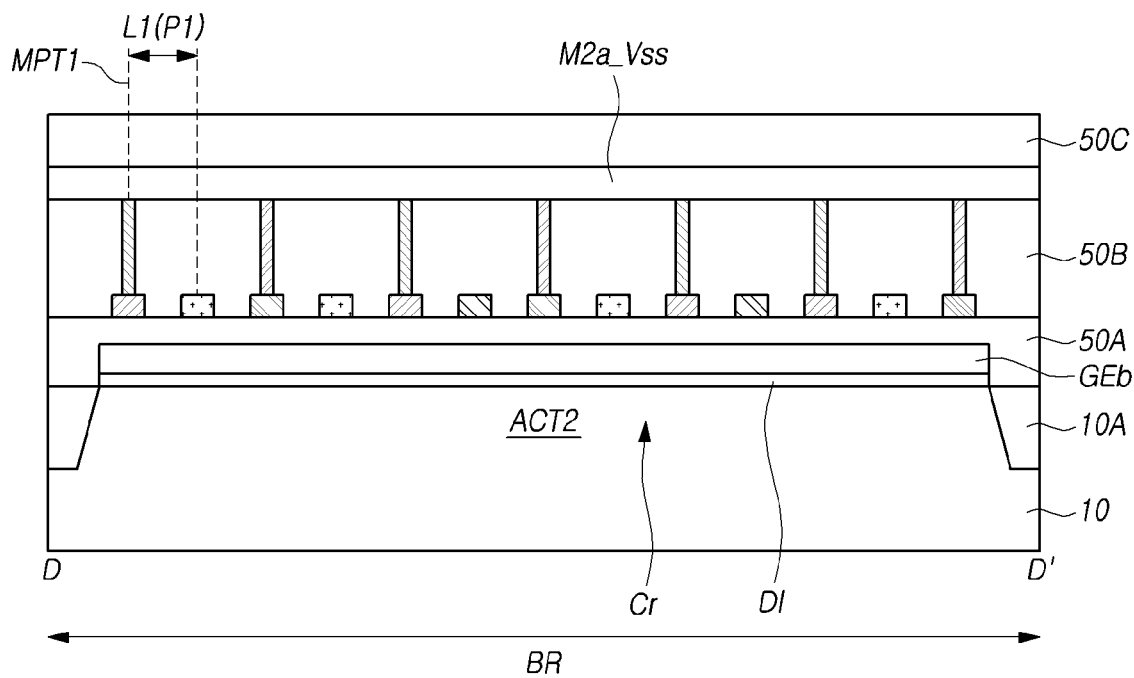
FIG. 11 is a cross-sectional view taken along the line D-D' of FIG. 7.
Figure 12:
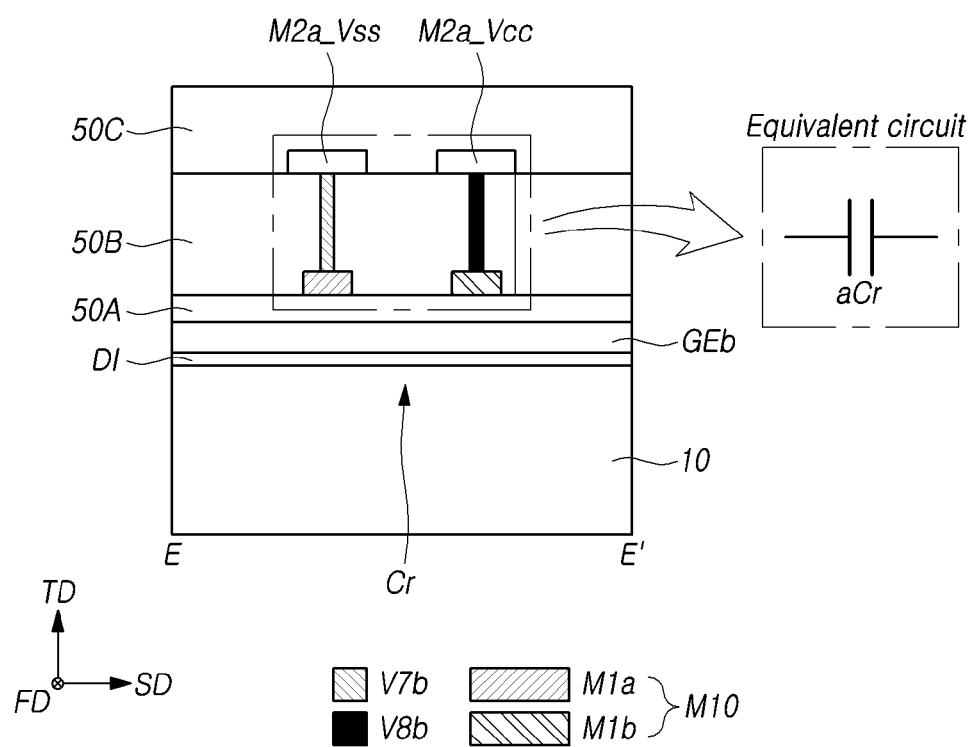
FIG. 12 is a cross-sectional view taken along the line E-E' of FIG. 7.
Figure 13:
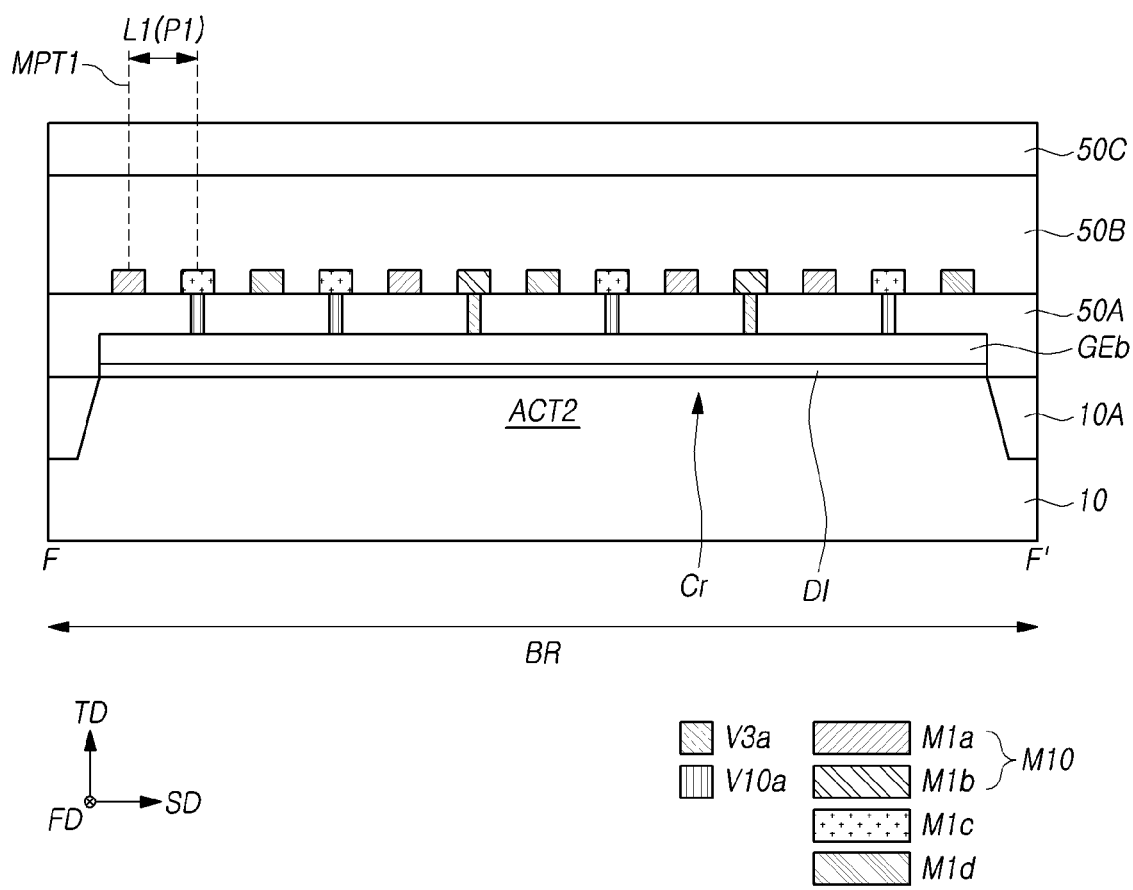
FIG. 13 is a cross-sectional view taken along the line F-F' of FIG. 7.
Figure 14:
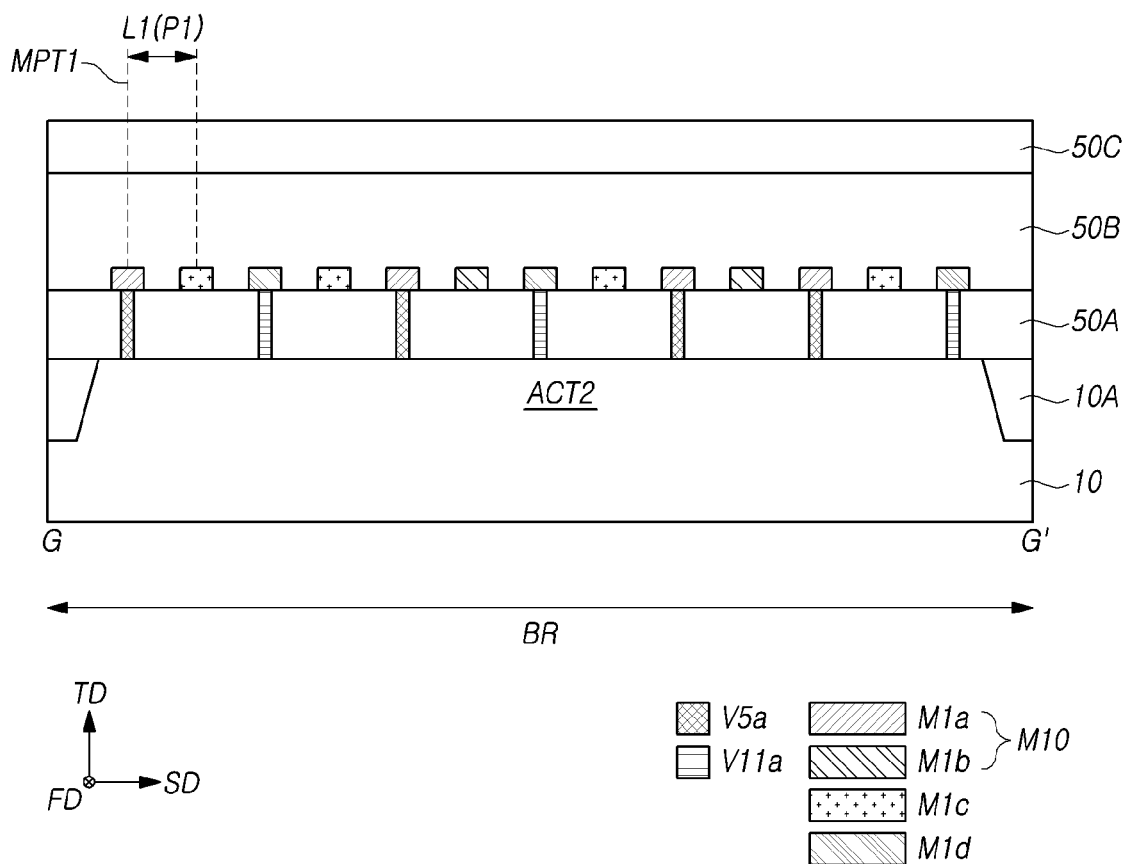
FIG. 14 is a cross-sectional view taken along the line G-G' of FIG. 7.

FIG. 8 is a cross-sectional view taken along the line A-A' of FIG. 7, FIG. 9 is a cross-sectional view taken along the line B-B' of FIG. 7, FIG. 10 is a cross-sectional view taken along the line C-C' of FIG. 7, FIG. 11 is a cross-sectional view taken along the line D-D' of FIG. 7, FIG. 12 is a cross-sectional view taken along the line E-E' of FIG. 7, FIG. 13 is a cross-sectional view taken along the line F-F' of FIG. 7, and FIG. 14 is a cross-sectional view taken along the line G-G' of FIG. 7. Hereinbelow, detailed descriptions for the technical features overlapping with those described above with reference to FIGS. 3 to 7 will be omitted, and only differences will be described in detail.

Referring to FIGS. 7 to 14, the one or more isolation patterns 10A which defines the first active patterns ACT1 and the second active pattern ACT2 may be formed in the first substrate 10. The one or more isolation patterns 10A may include a silicon oxide layer. The first active patterns ACT1 may be disposed in the first and second block regions AR1 and AR2 (see FIG. 7) on either side of the second active pattern ACT2. The second active pattern ACT2 may be disposed in the decoupling capacitor region BR (see FIG. 7).

The first gate patterns GEa, which extend in the first direction FD while traversing (e.g., crossing over or crossing across) the first active patterns ACT1, may be defined on the first substrate 10 of the first and second block regions AR1 and AR2. The first gate patterns GEa may be aligned with (e.g., trace) the gate pattern tracks GPT. The gate pattern tracks GPT may be arranged in the second direction SD at the predetermined interval L2. The distance between a pair of adjacent gate pattern tracks GPT may be the second distance L2. The pitch of the gate pattern tracks GPT may be the second pitch P2. The center lines of the first gate patterns GEa may overlap with the gate pattern tracks GPT, respectively. The minimum pitch between the first gate patterns GEa may be the second pitch P2, and the second pitch P2 may be the same as the second distance L2. The sources S and the drains D may be defined in the first active patterns ACT1 on both sides of the first gate patterns GEa.

The second gate pattern GEb may be defined on the second active pattern ACT2 of the decoupling capacitor region BR. When viewed from above (e.g., plan view) from the third direction TD, at least portions of, the second active pattern ACT2 may be exposed around the perimeter of the second gate pattern GEb. The dielectric layer pattern DI may be interposed between the second gate pattern GEb and the first substrate 10.

The first dielectric layer 50A may be formed on the first substrate 10, and thereby, may cover the first active patterns ACT1, the second active pattern ACT2, the first gate patterns GEa and the second gate pattern GEb. The second dielectric layer 50B and the third dielectric layer 50C may be sequentially stacked on the first dielectric layer 50A. Included in or at the bottom of the second dielectric layer 50B is wiring line layer M1 (see FIG. 1). Included in or at the bottom of the third dielectric layer 50C is wiring line layer M2. Each of the first to third dielectric layers 50A to 50C may include a silicon oxide layer.

In various embodiments, the internal wiring line patterns M1a and the power routing patterns M1b may be disposed on the first bottom interlayer dielectric layer 50A in wiring line layer M1 (which is at the bottom of the second dielectric layer 50B). The internal wiring line patterns M1a and the power routing patterns M1b may extend in the first direction FD.

Referring again to FIGS. 7 to 9, the first vertical vias V1a which pass through the first bottom interlayer dielectric layer 50A may be formed under the internal wiring line patterns M1a, and, may, therefore, electrically couple the internal wiring line patterns M1a to the first gate patterns GEa, the sources S and/or the drains D of the circuit elements TR. Note that in some embodiments, the first vertical vias V1a may not be formed under the power routing patterns M1b.

In various embodiments, the internal wiring line patterns M1a and the power routing patterns M1b may be aligned with (e.g., trace) the wiring line pattern tracks MPT1. For these embodiments, the distance between a pair of adjacent wiring line pattern tracks MPT1 may be the first distance L1. The wiring line pattern tracks MPT1 may be arranged in the second direction SD at the predetermined interval L1. The pitch of the wiring line pattern tracks MPT1 may be the first pitch P1, and the first pitch P1 may be the same as the first distance L1. In some embodiments, these distances may be preset.

The center lines of the internal wiring line patterns M1a and the power routing patterns M1b may track/trace the wiring line pattern tracks MPT1, respectively. The power routing patterns M1b may, together with the internal wiring line patterns M1a, define the first wiring line patterns M10. The minimum pitch of the first wiring line patterns M10 may be the first pitch P1, and the first pitch P1 may be the same as the first distance L1. An interval between adjacent first wiring line patterns M10 may be m*P1 (m is a natural number).

The first power line M2_Vcc and the second power line M2_Vss may be defined/formed on the second bottom interlayer dielectric layer 50B (e.g., disposed in or at the bottom of the third dielectric layer 50C). The first power line M2_Vcc and the second power line M2_Vss may extend in the second direction SD and may parallel each other. The first power line M2_Vcc may be disposed over the first type block region ARP, and the second power line M2_Vss may be disposed over the second type block region ARN.

The second vertical vias V2b which pass through the second dielectric layer 50B may be formed under the first power line M2_Vcc, and may, therefore, electrically couple the first power line M2_Vcc and the power routing patterns M1b.

The fourth vertical vias V4b which pass through the second dielectric layer 50B may be formed under the second power line M2_Vss, and may, therefore, electrically couple the sources S of the second type block region ARN to the second power line M2_Vssthrough the internal wiring line patterns M1a. That is, the fourth vertical vias V4b may electrically couple the second power line M2_Vss to the internal wiring line patterns M1a, which in turn may be electrically coupled to the sources S through first vias V1a.

Referring again to FIGS. 7 and 13, the power routing patterns M1b may extend toward the decoupling capacitor region BR in the first direction FD, and may overlap (e.g., crosses or passes over) at least partially with the decoupling capacitor Cr in the vertical direction (e.g., third direction TD). The third vertical vias V3a which pass through the first bottom interlayer dielectric layer 50A may be formed where the power routing patterns M1b and the second gate pattern GEb of the decoupling capacitor Cr overlap with each other, and may, therefore, electrically couple the power routing patterns M1b and the second gate pattern GEb.

Referring again to FIGS. 7 and 14, the internal wiring line patterns M1a, which are coupled to the second power line M2_Vss through the fourth vertical vias V4b, may extend toward the decoupling capacitor region BR in the first direction FD, and may overlap at least partially with the decoupling capacitor Cr in the vertical direction. The fifth vertical vias V5a, which pass through the first dielectric layer 50A, may be formed between where the internal wiring line patterns M1a (that is coupled to the second power line M2_Vss) and the second active pattern ACT2 of the decoupling capacitor Cr overlap with each other, and may, therefore, electrically couple the second power line M2_Vss to the second active pattern ACT2 through internal wiring line patterns M1a.

Referring again to FIGS. 7, 10 and 11, in the decoupling capacitor region BR, the additional first power line M2a_Vcc and the additional second power line M2a_Vss may be defined/formed on the second dielectric layer 50B (thus, the additional second power line M2a_Vss may be in or at the bottom of the third dielectric layer 50C). In various embodiments, the additional first power line M2a_Vcc and the additional second power line M2a_Vss may extend in the second direction SD.

The sixth vertical vias V6b which pass through the second dielectric layer 50B may be formed between the additional first power line M2a_Vcc and the power routing patterns M1b, and as noted above, may electrically couple the additional first power line M2a_Vcc to the power routing patterns M1b.

The seventh vertical vias V7b which pass through the second dielectric layer 50B may be formed under the additional second power line M2a_Vss. As a result, the internal wiring line patterns M1a, which are also coupled to the second power line M2_Vss, may couple the additional second power line M2a_Vss as well as the second power line M2_Vss to the second active pattern ACT2. The additional first power line M2a_Vcc and the additional second power line M2a_Vss may be disposed at the middle of the decoupling capacitor region BR in the first direction FD.

Above the decoupling capacitor region BR, the first power strap lines M1c and the second power strap lines M1d may be defined/disposed on the first dielectric layer 50A (e.g., disposed in the first wiring line layer M1 that is located in or at the bottom of the second dielectric layer 50A). The first power strap lines M1c and the second power strap lines M1d may extend in the first direction FD. The first power strap lines M1c and the second power strap lines M1d may be disposed parallel to the internal wiring line patterns M1a and the power routing patterns M1b. In various embodiments, the first power strap lines M1c and the second power strap lines M1d may be aligned with (e.g., trace) the wiring line pattern tracks MPT1. The center lines of the first power strap lines M1c and the second power strap lines M1d may overlap with the wiring line pattern tracks MPT1, respectively.

The eighth vertical vias V8b, which pass through the second dielectric layer 50B, may be formed between the additional first power line M2a_Vcc and the first power strap lines M1c, and may, therefore, electrically couple the additional first power line M2a_Vcc to the first power strap lines M1c, which may be further electrically coupled to the second gate pattern GEb as will be described below. The ninth vertical vias V9b, which pass through the second dielectric layer 50B, may be formed between the additional second power line M2a_Vss and the second power strap lines M1d, and may, therefore, electrically couple the additional second power line M2a_Vss to the second power strap lines M1d, which may be further electrically coupled to the second active pattern ACT2 as will be described below.

Referring to FIGS. 7, 13 and 14, the tenth vertical vias V10a, which pass through the first dielectric layer 50A, may be formed between the first power strap lines M1c and the second gate pattern GEb of the decoupling capacitor Cr, and may, therefore, electrically couple the first power strap lines M1c to the second gate pattern. The eleventh vertical vias V11a, which pass through the first dielectric layer 50A, may be formed under the second power strap lines M1d and the second active pattern ACT2, and may, therefore, electrically couple the second power strap lines M1d to the second active pattern ACT2 of the decoupling capacitor Cr.

As illustrated in FIGS. 7 and 10, a first power mesh which is constituted by the additional first power line M2a_Vcc that is defined/formed at the second wiring line layer M2, the power routing patterns M1b and the first power strap lines M1c defined/formed at the first wiring line layer M1, and the sixth and eighth vertical vias V6b and V8b, which couples the power routing patterns M1b and the first power strap lines M1c to the additional first power line M2a_Vcc, may be provided in or above the decoupling capacitor region BR. As illustrated in FIGS. 7 and 13, as a result of the first power strap lines M1c of the first power mesh being coupled to the second gate pattern GEb of the decoupling capacitor Cr through the tenth vertical vias V10a, electrical paths may be formed for for transferring the first power (for example, Vcc) loaded to the first power mesh to the second gate pattern GEb of the decoupling capacitor Cr.

As illustrated in FIGS. 7 and 11, a second power mesh may be provide that constitutes the additional second power line M2a_Vss that is defined/formed at the second wiring line layer M2, the internal wiring line patterns M1a and the second power strap lines M1d that are defined at the first wiring line layer M1, and the seventh and ninth vertical vias V7b and V9b coupling the additional second power line M3a_Vss to the internal wiring line patterns M1a and the second poe3r strap lines M1d. As illustrated in FIG. 14, since the second power strap lines M1d of the second power mesh are coupled to the second active pattern ACT2 of the decoupling capacitor Cr through the eleventh vertical vias V11a, electrical paths may be provided for for transferring the second power (for example, Vss) loaded to the second power mesh to the second active pattern ACT2. According to the present embodiment, by constituting the first and second power meshes in or above the decoupling capacitor region BR, the resistance components of electrical paths for transferring power to the decoupling capacitor Cr may be reduced. Therefore, by minimizing a voltage drop likely to occur in the electrical paths, it is possible to contribute to the stabilization of the operation of the decoupling capacitor Cr.

Referring again to FIGS. 7 and 12, the additional first power line M2a_Vcc and the additional second power line M2a_Vss may be disposed adjacent to each other. As a result, the sixth and eighth vertical vias V6b and V8b, which are under the additional first power line M2a_Vcc, and the seventh and ninth vertical vias V7b and V9b, which are under the additional second power line M2a_Vss, may also be disposed adjacent to each other.

In various embodiments, the sixth and eighth vertical vias V6b and V8b may provide a first electrode of an additional decoupling capacitor aCr. The seventh and ninth vertical vias V7b and V9b may provide a second electrode of the additional decoupling capacitor aCr. The dielectric material of the second dielectric layer 50B disposed between the sixth and eighth vertical vias V6b and V8b and the seventh and ninth vertical vias V7b and V9b may act as a dielectric layer of the additional decoupling capacitor aCr. The additional decoupling capacitor aCr, which is formed by the sixth and eighth vertical vias V6b and V8b, the seventh and ninth vertical vias V7b and V9b and the dielectric material of the second dielectric layer 50B between them may be provided in the second dielectric layer 50B. In various embodiments, the additional decoupling capacitor aCr may play substantially the same role as the decoupling capacitor Cr.

Since the sixth to ninth vertical vias V6b to V9b are disposed to overlap with the decoupling capacitor Cr, the additional decoupling capacitor aCr may overlap with the decoupling capacitor Cr in the vertical direction. Therefore, the additional decoupling capacitor aCr does not occupy a separate layout area. According to the present embodiment, even without occupying a separate layout area, it is possible to increase the capacity of a decoupling capacitor which plays the role of stabilizing a power level.

Figure 15A:
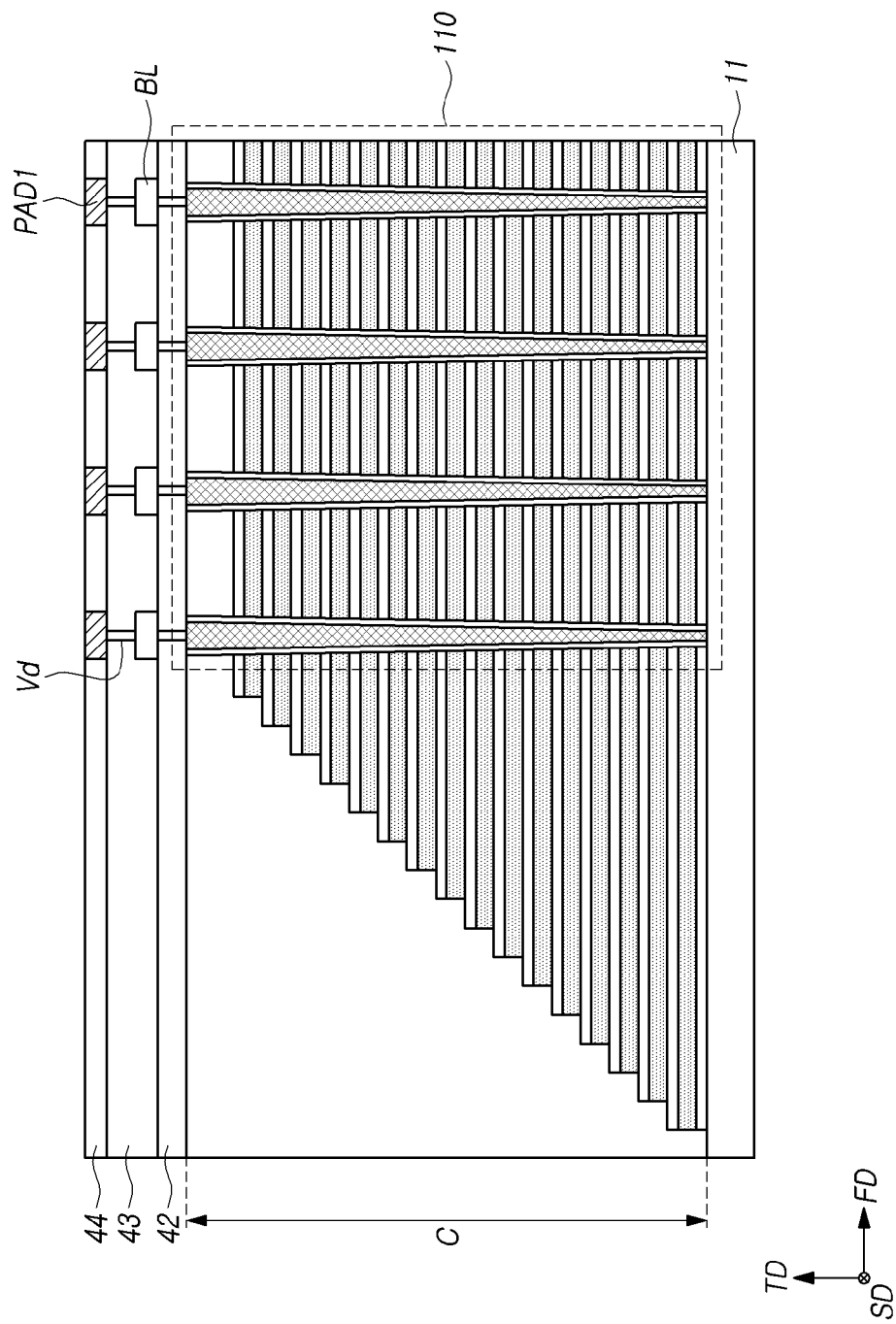
FIG. 15A is a cross-sectional view of an example memory structure of a semiconductor memory device according to one embodiment.
Figure 15B:
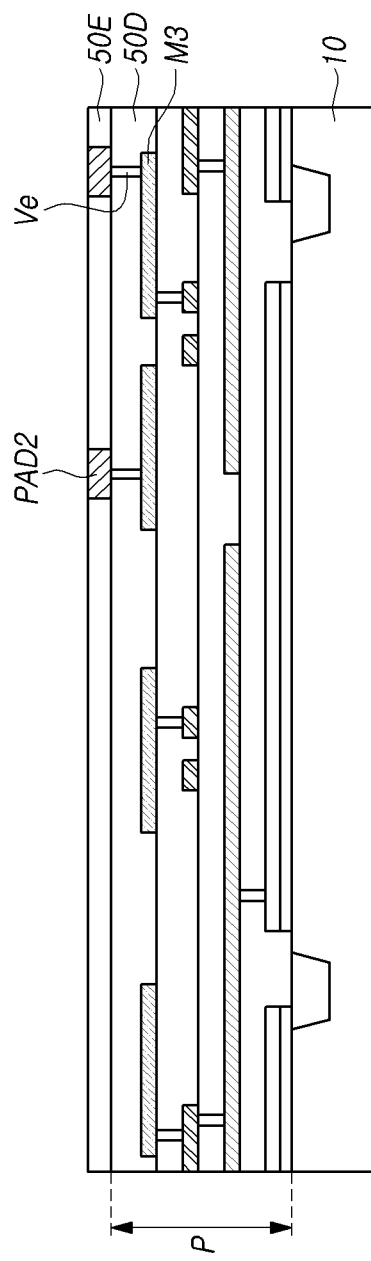
FIG. 15B is a cross-sectional view of an example corresponding logic structure for the memory structure illustrated in FIG. 15A according to one embodiment.

FIGS. 15A to 15C are separate cross-sectional views of a first structure that includes a memory structure C of a semiconductor device, a second structure that includes a logic structure P of the same semiconductor memory device, as well as the cross-sectional view of the semiconductor memory device when the first structure (with the memory structure C) and the second structure (with the logic structure P) are combined according to one embodiment. In the present embodiment, detailed descriptions for the technical features overlapping with those described above with reference to FIGS. 3 to 14 will be omitted, and only differences will be described in detail.

Referring to FIG. 15A, which illustrates the first structure (with the memory structure C), a third top interlayer dielectric layer 43 may be defined/formed on the second top interlayer dielectric layer 42, and thereby, may cover the bit lines BL. While not illustrated, wiring line patterns which are electrically coupled to the electrode layers 22 of the memory cell array 110 may be defined at the same layer as the bit lines BL, and the third top interlayer dielectric layer 43 may cover the wiring line patterns. First pads PAD1 which are coupled to the bit lines BL and the wiring line patterns through vertical vias Vd may be defined on the third top interlayer dielectric layer 43. A fourth top interlayer dielectric layer 44 may be formed on the third top interlayer dielectric layer 43, and may, therefore, cover the side surfaces of the first pads PAD1 while exposing the top surfaces of the first pads PAD1.

Referring to FIG. 15B, which is a cross-sectional view of the second structure (with the logic structure P), a plurality of second pads PAD2, which are coupled to the third wiring line layer M3 through vertical vias Ve, may be defined/formed on the fourth dielectric layer 50D. A fifth dielectric layer 50E may be defined/formed on the fourth dielectric layer 50D, and may, therefore, cover the side surfaces of the second pads PAD2 while exposing the top surfaces of the second pads PAD2.

When the second structure (with the logic structure P) illustrated in FIG. 15B is then stacked on the first structure (with the memory structure C) illustrated in FIG. 15A, it is turned upside down and is then stacked on the first structure, resulting in the semiconductor device as illustrated in FIG. 15C may be provided. As the second pads PAD2 of the structure illustrated in FIG. 15B are bonded to the first pads PAD1 of the structure illustrated in FIG. 15A, electrical paths may be formed. According to the present embodiment, the logic structure P may be disposed over the memory structure C. As a result, a semiconductor device having a POC (peri over cell) structure is formed.

Figure 16:
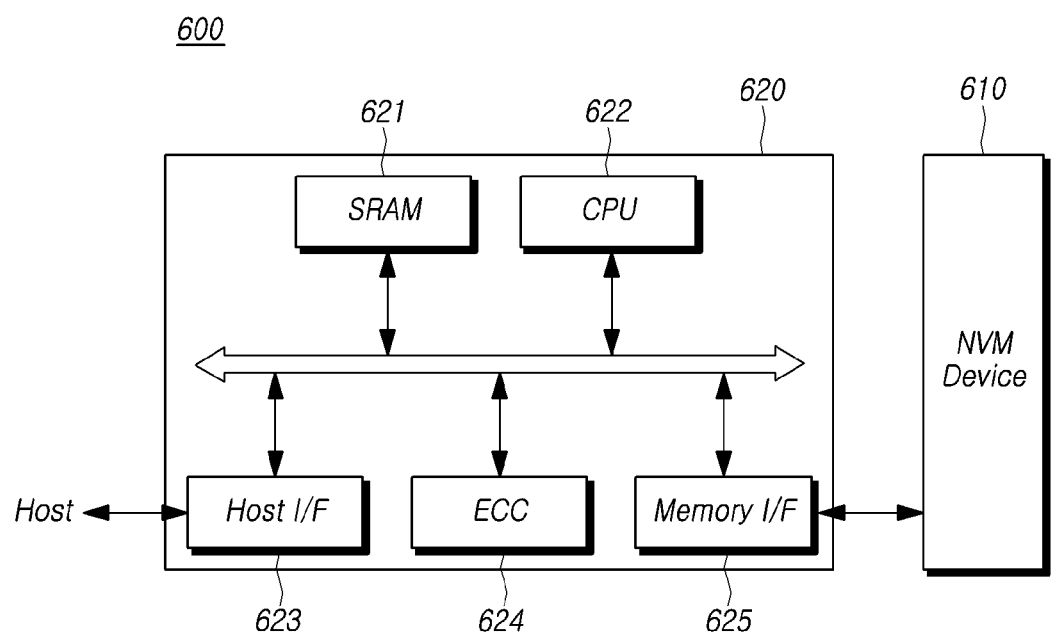
FIG. 16 is a block diagram schematically illustrating a representation of an example of a memory system including a semiconductor device in accordance with an embodiment.

FIG. 16 is a block diagram schematically illustrating a representation of an example of a memory system including a semiconductor device having the semiconductor device structure as described above. The memory system 600 in accordance with an embodiment may include a nonvolatile memory device 610 and a memory controller 620. In various embodiments, the nonvolatile memory device 610 may include the semiconductor device structure described above and may operate in the manner described above. The memory controller 620 may be configured to control the nonvolatile memory device 610. In some embodiments, the combination of the nonvolatile memory device 610 and the memory controller 620 may embody a memory card and/or a solid state disk (SSD). By the combination of the nonvolatile memory device 610 and the memory controller 620, a memory card or a solid state disk (SSD) may be provided. In various embodiments, the memory system 600 may include an SRAM 621 that may be used as a working memory of a processing unit 622. A host interface 623 may include a data exchange protocol of a host which is coupled with the memory system 600.

In various embodiments, the memory system 600 may include an error correction code block 624 that detects and corrects an error included in data read from the nonvolatile memory device 610. The memory system 600 may include a memory interface 625 that interfaces with the nonvolatile memory device 610. As illustrated in FIG. 16, the memory system 600 may include a processing unit 622 that performs general control operations for data exchange of the memory controller 620.

Although not illustrated in FIG. 16, it is obvious to a person of ordinary skilled in the relevant art that the memory system 600 in accordance with the embodiment may be additionally provided with a ROM, which may store code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, with a low probability of error occurring. In particular, the nonvolatile memory device 610, in accordance with various embodiments, may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 17:
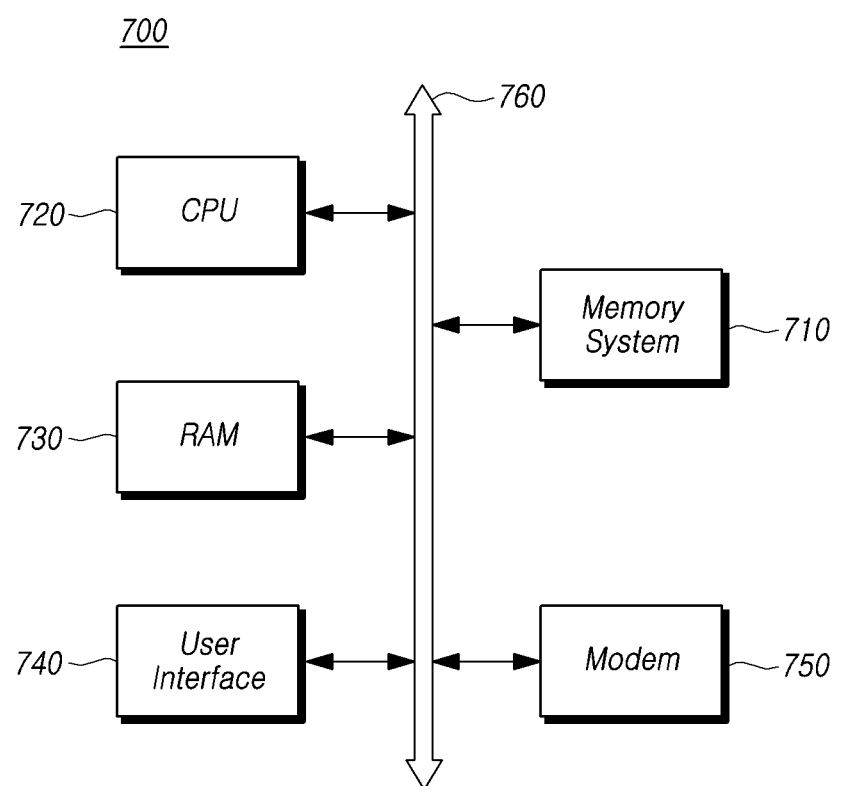
FIG. 17 is a block diagram schematically illustrating a representation of an example of a computing system including a semiconductor device in accordance with an embodiment.

FIG. 17 is a block diagram schematically illustrating a representation of an example of a computing system 700 including a semiconductor device having the semiconductor device structure as described above. The computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

After reviewing the present disclosure, an individual of ordinary skill in the art will immediately appreciate that some details and features can be added, removed and/or changed without deviating from the spirit of the invention. Reference throughout this specification to "one embodiment," "an embodiment," "additional embodiment(s)" or "some embodiments," means that a particular feature, structure or characteristic described in connection with the embodiment(s) is included in at least one or some embodiment(s), but not necessarily all embodiments, such that the references do not necessarily refer to the same embodiment (s). Furthermore, the particular features, steps, structures, or characteristics may be combined in any suitable manner in one or more embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor device comprising:
a substrate provided with a decoupling capacitor and plurality of circuit elements disposed along a first direction; and
a plurality of first wiring line patterns disposed in a first wiring line layer over the substrate, including a power routing pattern coupled to the decoupling capacitor and a plurality of internal wiring line patterns coupled to the plurality of circuit elements,
wherein the plurality of first wiring line patterns extend in the first direction, and are aligned in conformity with virtual wiring line pattern tracks which are defined at a first pitch along a second direction intersecting the first direction and parallel to the substrate.

2. The semiconductor device according to claim 1,
wherein the plurality of circuit elements comprising:
a plurality of active patterns defined in the substrate; and
a plurality of gate patterns disposed over the substrate and extending in the first direction while traversing the plurality of active patterns,
wherein the plurality of circuit elements are configured such that an interval between active patterns which are adjacent to each other in the second direction is constant as a first interval.

3. The semiconductor device according to claim 2,
wherein the power routing pattern is disposed within the first interval when viewed on a top.

4. The semiconductor device according to claim 2,
wherein the plurality of gate patterns are aligned in conformity with a plurality virtual gate pattern tracks which are arranged at a second pitch in the second direction.

5. The semiconductor device according to claim 2, further comprising:
at least one dummy gate pattern disposed at the same layer as the plurality of gate patterns for uniformity of pattern density.

6. The semiconductor device according to claim 5,
wherein the dummy gate pattern is aligned with a remaining virtual gate pattern track that is not used for alignment of the plurality of gate patterns among a plurality virtual gate pattern tracks which are arranged at a second pitch in the second direction.

7. The semiconductor device according to claim 5,
wherein the dummy gate pattern is disposed within the first interval when viewed on a top.

8. The semiconductor device according to claim 1,
wherein the first wiring line layer is positioned closest to the substrate among a plurality of wiring line layers provided along a vertical direction over the substrate.

9. The semiconductor device according to claim 1,
wherein the decoupling capacitor comprising:
a first electrode formed as an active pattern which is defined within the substrate; and
a second electrode formed as a gate pattern over the active pattern, wherein the power routing pattern coupled to any one of the first electrode and the second electrode.

10. The semiconductor device according to claim 1, further comprising:
a first power line disposed in a second wiring line layer over the first wiring line layer, and transferring a first power to a first electrode of the decoupling capacitor through the power routing pattern; and
a second power line disposed in the second wiring line layer, and transferring a second power to a second electrode of the decoupling capacitor through one of the plurality of internal wiring line patterns,
wherein the substrate includes a block region in which the plurality of circuit elements are disposed and a decoupling capacitor region in which the decoupling capacitor is disposed,
wherein the first power line and the second power line are disposed in a block region, the first power line is disposed further away from the decoupling capacitor region than the second power line.

11. The semiconductor device according to claim 1, further comprising:
an additional first power line coupled to the power routing patterns; and
an additional second power line coupled to the one of the plurality of internal wiring line patterns,
wherein the substrate includes a block region in which the plurality of circuit elements are disposed and a decoupling capacitor region in which the decoupling capacitor is disposed,
wherein the additional first power line and the additional second power line are disposed in the decoupling capacitor region of a second wiring line layer.

12. The semiconductor device according to claim 11, further comprising:
a first power strap line coupled to the additional first power line; and
a second power strap line coupled to the additional second power line,
wherein the first power strap line and the second power strap line are disposed in the decoupling capacitor region of the first wiring line layer.

13. The semiconductor device according to claim 12,
wherein each of the first power strap line and the second power strap line extends in the first direction and is aligned in conformity with one of the virtual wiring line pattern tracks.

14. The semiconductor device according to claim 12, further comprising
an additional decoupling capacitor,
wherein the additional decoupling capacitor including:
a first electrode which includes a first vertical via coupling the additional first power line to the power routing pattern and a second vertical via coupling the additional first power line to the first power strap line;
a second electrode which includes a third vertical via coupling the additional second power line to the one of the plurality of internal wiring line patterns and a fourth vertical via coupling the additional second power line to the second power strap line; and
a dielectric layer between the first electrode and the second electrode.

15. A semiconductor device comprising:
a memory structure; and
a logic structure bonded to the memory structure,
the logic structure comprising
a substrate provided with a decoupling capacitor and a plurality of transistors disposed along a first direction; and
a plurality of first wiring line patterns disposed in a first wiring line layer over the substrate, including a plurality of internal wiring line patterns coupled to the plurality of transistors and a power routing pattern coupled to the decoupling capacitor,
wherein the plurality of first wiring line patterns extend in the first direction and are aligned in conformity with virtual wiring line pattern tracks which are defined at a first pitch along a second direction intersected with the first direction and parallel to the substrate.

16. The semiconductor device according to claim 15, wherein the plurality of transistors comprising:
a plurality of active patterns defined in the substrate; and
a plurality of gate patterns disposed over the substrate and extending in the first direction while traversing the plurality of active patterns,
wherein the plurality of transistors are configured such that an interval between active patterns which are adjacent to each other in the second direction is constant as a first interval.

17. The semiconductor device according to claim 16, wherein the power routing pattern is disposed within the first interval when viewed on a top.

18. The semiconductor device according to claim 15, wherein a plurality of gate patterns of the plurality of transistors are aligned in conformity with virtual gate pattern tracks which are arranged at a second pitch in the second direction.

19. The semiconductor device according to claim 18, further comprising:
a dummy gate pattern aligned with a virtual gate pattern track in which the plurality of gate patterns are not used for alignment.

20. The semiconductor device according to claim 15, wherein the first wiring line layer is positioned closest to the substrate among a plurality of wiring line layers provided along a vertical direction over the substrate.

* * * * *